US009100035B2

(12) United States Patent
Dasgupta et al.

(10) Patent No.: US 9,100,035 B2
(45) Date of Patent: Aug. 4, 2015

(54) ASYNCHRONOUS SAMPLING USING A DYNAMICALLY ADUSTABLE SNAPBACK RANGE

(71) Applicant: TEXAS INSTRUMENTS INCORPORATED, Dallas, TX (US)

(72) Inventors: Udayan Dasgupta, Bangalore (IN); Abhijit A. Patki, Bangalore (IN); Ganesan Thiagarajan, Bangalore (IN); Janakiraman S, Bangalore (IN); Madhulatha Bonu, Bangalore (IN); Venugopal Gopinathan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/194,208

(22) Filed: Feb. 28, 2014

(65) Prior Publication Data

US 2014/0247172 A1 Sep. 4, 2014

Related U.S. Application Data

(60) Provisional application No. 61/922,271, filed on Dec. 31, 2013, provisional application No. 61/922,282, filed on Dec. 31, 2013, provisional application No. 61/922,291, filed on Dec. 31, 2013, provisional application No. 61/922,309, filed on Dec. 31, 2013, provisional application No. 61/922,316, filed on Dec. 31, 2013, provisional application No. 61/922,533, filed on Dec. 31, 2013.

(30) Foreign Application Priority Data

| | | | |
|---|---|---|---|
| Mar. 1, 2013 | (IN) | ............................. | 913/CHE/2013 |
| Mar. 4, 2013 | (IN) | ............................. | 927/CHE/2013 |
| Mar. 6, 2013 | (IN) | ............................. | 971/CHE/2013 |
| Mar. 13, 2013 | (IN) | ........................... | 1066/CHE/2013 |
| Mar. 15, 2013 | (IN) | ........................... | 1132/CHE/2013 |

(51) Int. Cl.

| | |
|---|---|
| ***H03M 1/34*** | (2006.01) |
| ***H03M 1/12*** | (2006.01) |
| ***H03M 1/08*** | (2006.01) |
| ***H03M 1/18*** | (2006.01) |
| *H03M 1/36* | (2006.01) |

(52) U.S. Cl.

CPC .............. *H03M 1/125* (2013.01); *H03M 1/089* (2013.01); *H03M 1/0836* (2013.01); *H03M 1/0845* (2013.01); *H03M 1/0854* (2013.01); *H03M 1/124* (2013.01); *H03M 1/186* (2013.01); *H03M 1/1265* (2013.01); *H03M 1/36* (2013.01)

(58) Field of Classification Search

CPC ......... H03M 1/125; H03M 1/12; H03M 1/18; H03M 1/181; H03M 1/069

USPC .................................. 341/118, 120, 139, 155

See application file for complete search history.

(56) References Cited

U.S. PATENT DOCUMENTS

| | | | | |
|---|---|---|---|---|
| 4,246,571 | A * | 1/1981 | Gariazzo ........................ | 341/143 |
| 6,404,372 | B1 * | 6/2002 | Heithoff ......................... | 341/155 |

(Continued)

OTHER PUBLICATIONS

Akima, H., A New Method of Interpolation and Smooth Curve Fitting Based on Local Procedures, Journal of the Association of Computing Machinery, vol. 17, No. 4, Oct. 1970, pp. 589-602.

*Primary Examiner* — Linh Nguyen

(74) *Attorney, Agent, or Firm* — Alan A. R. Cooper; Frank D. Cimino

(57) ABSTRACT

A snapout calculator, and wherein the snapout calculator determines where the reference levels for the various comparators shall be placed after each asynchronous sample is generated.

17 Claims, 19 Drawing Sheets

(56) References Cited

U.S. PATENT DOCUMENTS

| | | | | |
|---|---|---|---|---|
| 7,973,692 | B2 * | 7/2011 | Chmelar et al. | 341/159 |
| 8,456,640 | B2 * | 6/2013 | Li et al. | 356/445 |
| 8,872,691 | B1 * | 10/2014 | Stepanovic | 341/158 |
| 2003/0218561 | A1 * | 11/2003 | Hales | 341/163 |
| 2008/0024346 | A1 * | 1/2008 | Kok et al. | 341/155 |
| 2010/0201558 | A1 * | 8/2010 | Wiesbauer et al. | 341/155 |
| 2011/0109489 | A1 * | 5/2011 | Henzler et al. | 341/143 |
| 2014/0043175 | A1 * | 2/2014 | Fogleman et al. | 341/110 |
| 2014/0062734 | A1 * | 3/2014 | Thiagarajan et al. | 341/110 |
| 2014/0184436 | A1 * | 7/2014 | Lee et al. | 341/161 |

* cited by examiner

| TERM | DESCRIPTION |
|---|---|
| DAC | Digital to Analog converter |
| Sampler | Logic which generate samples of the input continuous analog signal |
| Flash ADC | ADC constructed using "Flash" architecture |
| TDC | Time to digital converter – generates time stamps for events in terms of the given time resolution in seconds |
| $T_{poll}$ | Polling interval – time between two polling instants when the comparators are used in "Flash ADC" mode |
| $T_{blank}$ | Blanking time – time when the comparator outputs are held in reset state. During this time, the DAC voltages are programmed for next sampling window. Blanking is applied after a valid level crossing sample including the inserted sample |
| $T_{out}$ | Time out – Time after which a sample is inserted in case no level crossing sample happened until $t_i + t_{out}$, where $t_i$ is the time instant of last valid sample |
| LSB | Least significant bit |
| MSB | Most significant bit |
| A-ADC | Asynchronous ADC |
| Asynchronous samples | 2-tuples $(t_k, l_k)$ representing the level $l_k$ which was crossed by the input signal at time instant $t_k$ |
| Radix-m | Rate at which the given range is reduced. That is, the amplitude span which bounds the analog input signal is reduced by a factor m at every step |
| Rail comparators | 2 comparators which bound the analog input signal at all the time except the blanking time |
| Poll comparators | All comparators except the rail comparators. However, rail comparators have dual role. During polling, they also act as polling comparators |
| Snapout | Reference voltage range between the rail comparators immediately after any valid level crossing sample including the inserted sample |
| Constant reference comparators | Comparators whose reference value is static over a period between two consecutive level crossing samples |
| Adaptive reference comparators | Comparators whose reference value is changed between two consecutive level crossing samples, but static between two polling instants |
| CDF, $F_X(x)$ | Cumulative distribution function of a random variable X, representing the quantity, $F_X(x) = Pr(X <= x)$ |
| Histogram | Estimated probability density function of a random variable X computed using the outcome of several but finite number of experiments. This is an approximation of the theoretical probability density function (PDF) of a random variable x, $f_X(x) = d F_X(x)/dx$ where the derivative is defined. Otherwise, PDF and CDF of random variable X are related as $F_X(x) = \int f_X(x)\, dx$ |
| $[dV/dt]_n$ | Estimated slope of the signal V(t) computed using samples $t_{-\infty}, \ldots, t_{-1}, t_0, t_1, t_2, \ldots, t_n$ |
| $\lvert X\rvert_{max}$ | Absolute maximum of signal X(t) |

TABLE 1

FIG. 3B

| ALGORITHM | COMPLEXITY FOR EACH OUTPUT POINT (IGNORING MULTIPLIES WITH CONSTANTS, TABLE LOOK-UPS) | | SNR (dB) |
|---|---|---|---|
| | ADDERS | MULTIPLIERS | |
| AKIMA | 20 | 17 | 44 |
| MODIFIED AKIMA | 14 | 10 | 49 |
| CUBIC SPLINE | 36 | 24 | 51 |
FIG. 13
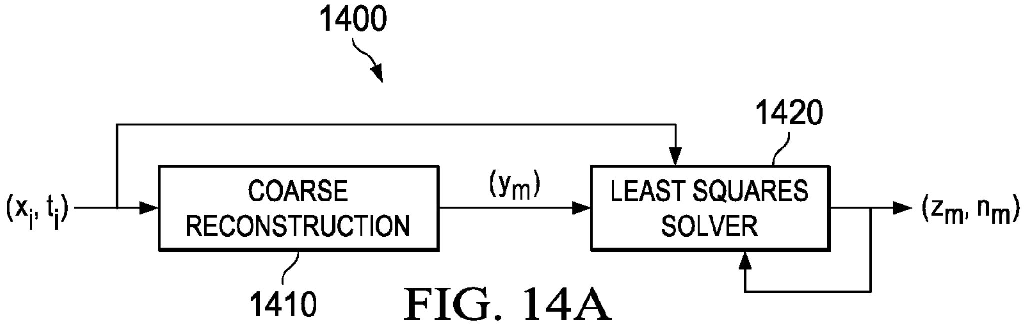
FIG. 14A
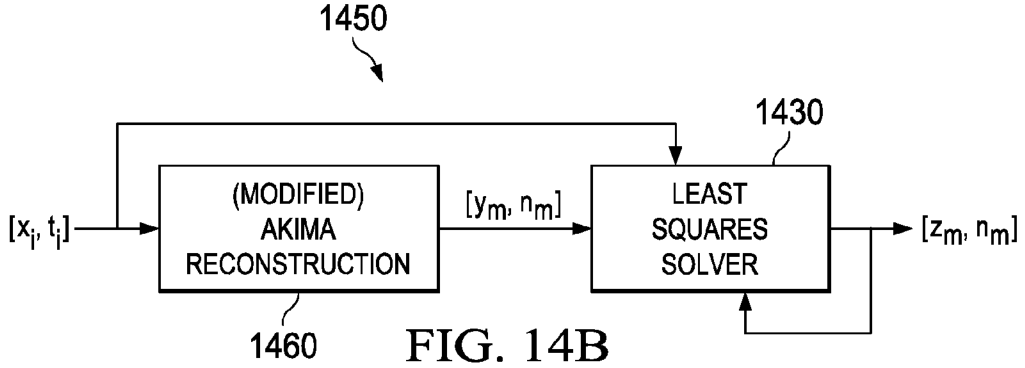
FIG. 14B

| | LUTs | ADDITIONS | MULTIPLICATIONS | MULTIPLICATIONS @ $R_A = 6R_S$ (ILLUSTRATIVE ONLY) |
|---|---|---|---|---|
| AKIMA | $3R_S$ | $20R_S$ | $17R_S$ | $17R_S$ |
| MODIFIED AKIMA INTERPOLATION | $3R_S$ | $14R_S$ | $10R_S$ | $10R_S$ |
| CUBIC SPLINE INTERPOLATION | $4R_A$ | $11R_A + 7R_S$ | $8R_A + 3R_S$ | $51R_S$ |
| BLOCK SOLVER USING WINDOWED SINC KERNEL | | | $O(P^2)$ WHERE P IS THE NUMBER OF ASYNCHRONOUS OBSERVATIONS | $O(6*5)^2.R_S$ FOR A BLOCK SIZE OF 5 |
| PROPOSED SCHEME (INCLUDING MODIFIED AKIMA FOR COARSE RECONSTRUCTION) | $19R_S$ | $44R_S$ | $43R_S$ (@ w=7) | $43R_S$ |

FIG. 17

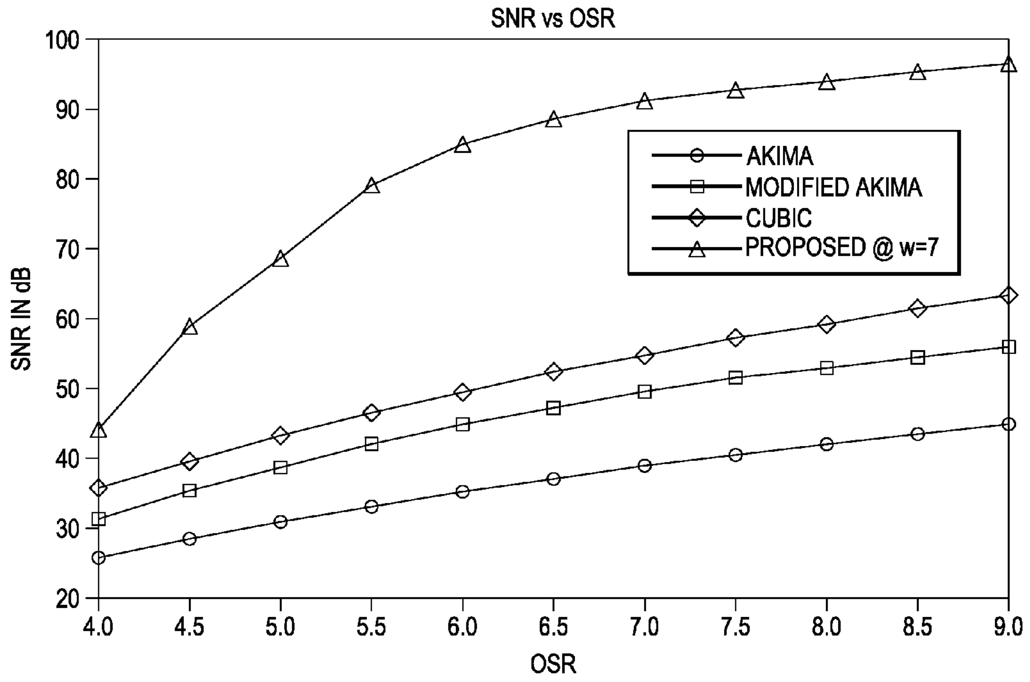

FIG. 18

ASYNCHRONOUS SAMPLING USING A DYNAMICALLY ADUSTABLE SNAPBACK RANGE

PRIORITY

This Application claims priority to Indian Application No. 1066/CHE/2013, filed Mar. 13, 2013, entitled "Leap Frog Sampler for Asynchronous ADCs", Indian Provisional Application No. 971/CHE/2013, filed Mar. 6, 2013, entitled "Low Complexity Non-Uniform Interpolation Algorithm", Indian Application 927/CHE/2013, filed Mar. 4, 2013, entitled "High Performance Non-Uniform Interpolation", Indian Application 913/CHE/2013 "ADC Range Extension Using Post-Processing Logic" filed Mar. 1, 2013, and Indian Application No. 1132/CHE/2013, entitled "Rate Enhancement Techniques for Asynchronous Samplers", filed Mar. 15, 2013, the entireties of all of which are hereby incorporated by reference. Also, this application claims the benefit of U.S. Provisional Application No. 61/922,271, filed Dec. 31, 2013, and U.S. Provisional Application No. 61/922,282, filed Dec. 31, 2013, and U.S. Provisional Application No. 61/922,291, filed Dec. 31, 2013, and U.S. Provisional Application No. 61/922,309, filed Dec. 31, 2013, and U.S. Provisional Application No. 61/922,316, filed Dec. 31, 2013, and U.S. Provisional Application No. 61/922,533, filed Dec. 31, 2013, the entireties of all of which are hereby incorporated by reference.

TECHNICAL FIELD

This Application is directed, in general, to an analog to digital converter (ADC), and more particularly, to an asynchronous ADC that reduces the excessive oversampling, inherent in level crossing based data converters, and reduces the complexity of reconstruction of asynchronously-sampled signals.

BACKGROUND

Generally, there are two basic types of ADC converters: a) synchronous and b) asynchronous. Synchronous ADCs are sampled at fixed intervals, as in FIG. 1A; and asynchronous ADCs, such as FIG. 1B, are sampled at variable intervals. Both types of ADCs have their weaknesses.

With synchronous ADCs, such as in FIG. 1A, there is the problem with its "quantization error" regarding measuring of analog input signals. Eg. if an input signal is between levels to be sampled by the ADC, when a sampling is "forced" by a clock, the digital sample, which coincides to one the ADC levels surrounding the signal, is generated. At this instant, a small error (voltage quantization error) is introduced in to the system, and a small fraction of the signal information is "lost".

Moreover, regarding synchronous ADCs, whether the input is full scale or half-full scale or one-tenth full-scale, the amount of quantization noise is actually the same; therefore, as the signal becomes smaller, the ratio of signal energy to quantization noise energy actually gets proportionately smaller.

One way of expressing a signal to noise ratio, is that of "Effective Number of Bits" or "ENOB". ENOB expresses the signal to noise ratio in terms of bits. As the input amplitude goes down, and the noise amplitude does not go down, then the ENOB also goes down—in other words, the precision of the digital output drops as the analog input signal amplitude drops since the noise amplitude holds steady.

In a synchronous ADC, if the signal level decreases, the noise [quantization error] remains the same, so there is a loss of signal to noise ratio. If quantization noise is the only noise source, specifically signal to quantization noise ratio (SQNR) decreases. In reality, the noise has multiple components such as thermal noise, quantization noise, noise due to non-linearity of devices, etc. Even in this case with all noise sources, SNR decreases as signal amplitude goes down or any of the noise sources increase.

There is an alternative approach to analog to digital conversion, using what is known as an "asynchronous analog to digital converter" ("asynchronous ADC"), such as in FIG. 1B. With asynchronous converters, such as discussed in "A non-uniform sampling technique for A/D conversion, Circuits and Systems, 1993, ISCAS '93, 1993 IEEE International Symposium on, vol., no., pp. 1220-1223 vol. 2, 3-6 May 1993", by Sayiner, N.; Sorensen, H. V.; Viswanathan, T. R. ("Sayiner"); a digital sample is generated when the input analog signal crosses a threshold ("level"). This is advantageous, because there is no voltage quantization error when signal crosses a known "level". This means that there is no voltage quantization noise in the output samples from an asynchronous ADC by itself. Please see FIGS. 1A-2B regarding the quantization noise, as shall be explained, below.

Moreover, the output of the asynchronous ADC is not directly usable by synchronous signal processing circuits that follow the ADC. Therefore, at the time of the conversion, a "2-tuple" is generated upon crossing a threshold, that of an output level and a "timestamp", which may be used in further processing to create synchronous samples usable by standard synchronous signal processing circuits However, the timestamp itself has quantization noise, a "time" quantization noise. This time quantization step and the associated effects are illustrated in FIG. 2A. Let us assume that the signal crosses level $V_2$, at time "T". Now, ideally [$V_2$, T] would be the asynchronous output. To reduce complexity the time "T" is stored in quantized form—chosen from the edges of a high resolution clock ($T_1$, $T_2$, $T_3$ . . . ). So, instead of [$V_2$, T], [$V_2$, $T_2$] is the 2-tuple actually stored, and hence a time quantization error $\Delta T=|T_2-T|$ is introduced.

As these time grids are assumed to be finely spaced from each other, the signal in this region can be approximated by a straight line with slope dV/dT. Hence the voltage quantization error, ΔV, introduced due to this time quantization error can be approximated as $\Delta V=dV/dT.\ \Delta T$. This shows that this kind of quantization error is proportional to signal, and hence the Signal to quantization noise from such quantization noise sources hold constant even if signal energy drops. In systems where this noise source is dominant, the SNR (or equivalently ENOB) does not drop with decrease in signal level.

Now, a given system may have different noise sources—elastic noise sources (like SNQR due to time quantization, jitter noise, etc.) which scale with signal levels, and inelastic noise sources (like voltage quantization noise present in synchronous ADCs, thermal noise, flicker noise, etc.) which do not scale with signals. If the dominant noise source is elastic in nature, the SNR (or ENOB) does not fall even if signal amplitude falls. Asynchronous systems can be designed such that inelastic noise sources become dominant only beyond a point—and till then the SNR does not fall even if signal falls. This region where the SNRs hold steady, is called a "flat band"—after which the inelastic noise sources become dominant, and the ENOB starts falling (similar to synchronous ADCs) as signal levels fall.

Moreover, regarding SQNR, as is understood by the present inventors, SQNR is proportional to the value computed by the expression, "−log(bandwidth*time quantization error)". As the bandwidth of the asynchronous ADC goes down, and the SQNR improves, for a given time quantization error.

FIG. 2B illustrates a "flat band" for an asynchronous ADC converter. As is illustrated, a hypothetical customer requirement is proposed. When the customer seeks 11.5 effective bits at ¼ fullscale, a conventional ADC provides that using a 14 bit (13.5 effective bits) ADC whereas the asynchronous ADC (with a 2-bit flat band) can provide the same with 12 effective bits ADC. Typically lower bit requirements translate to exponentially lower power requirements.

The red line shows the decrease in ENOB for a 12 effective bits synchronous ADC, which provides only 10 effective bits at ¼ full scale, thereby not satisfying the customers' requirements. Furthermore, traditional asynchronous ADC architectures, however, each have their own drawbacks.

As alluded to above, for conventional asynchronous ADC, the sampling rate is a function of the signal amplitude, number of active levels used for level crossing detection and signal frequency. Moreover, for some signal types, classical asynchronous ADC, as reported in Sayiner's work, tend to oversample the signal. For e.g., for an 8 level asynchronous ADC, a full-scale sine wave is sampled sixteen times, which is 8-times the minimum samples ("Nyquist rate") required for signal reconstruction. A 16 level asynchronous ADC may sample the same signal thirty two times, which is sixteen times more than the minimum required. Therefore, in the prior art, one always have an extremely large amount of oversampling.

That in turn translates to large amounts of power wasted especially if most of the samples are thrown away by the signal processing chain following the ADC. In addition, another drawback of traditional asynchronous ADCs is that they produce asynchronous (non-uniformly spaced in time) samples. Since the domain of asynchronous signal processing is nascent, most applications prefer to process synchronous samples. However, converting these non-uniform samples into uniform samples is a complex and power hungry task.

Furthermore, when converting, it would be advantageous to have an asynchronous ADC that addresses at least some of these drawbacks.

SUMMARY

A first aspect can provide a method, comprising: receiving an analog input; determining an upper outer rail and a lower outer rail as polling values to be used by voltage comparators; blanking at least three comparators; determining which two of the at least three comparators are closest to the input analog voltage levels; defining the two comparators which are closest to the analog input signal to be the set of rail comparators of the next sampling process; assigning a remaining comparator at a voltage level in between the new top and bottom voltage levels; enabling the outer rails, but blanking the other comparator; progressively narrowing down the voltage range spanned by the two outer comparators and finally generating a 2-tuple value of an asynchronous voltage comparator crossing.

A second aspect includes an apparatus, comprising: means for receiving an analog input; means for determining an upper outer rail and a lower outer rail as polling values to be used by voltage comparators; means for blanking at least three comparators; means for determining which two of the at least three comparators are closest to the input analog voltage levels; means for defining the two comparators which are closest to the analog input signal to be the set of rail comparators of the next sampling process; means for assigning the remaining comparator at a voltage level in between the new top and bottom voltage levels; means for enabling the outer rails, but blanking the other comparator; means for progressively narrowing down the voltage range spanned by the two outer comparators and finally means for generating a 2-tuple value of an asynchronous voltage comparator crossing.

A third aspect provides an apparatus, comprising: an asynchronous sampler, including: at least three voltage comparators, wherein the voltage comparators are configured to: receive an analog input; determine an upper outer rail and a lower outer rail as polling values to be used by voltage comparators; blank at least three comparators; determine which two of the at least three comparators are closest to the input analog voltage levels; define the two comparators which are closest to the analog input signal to be the set of rail comparators of the next sampling process; assign the remaining comparator at a voltage level in between the new top and bottom voltage levels enable the outer rails, but blanking the other comparator; progressively narrow down the voltage range spanned by the two outer comparators and finally generate a value of an asynchronous voltage comparator crossing; a time stamper, when the output of this is combined with the asynchronous sampler, creates a 2-tuple; and a digital reconstructor and resampler that creates a synchronous sampled signal from the asynchronously sampled signal.

BRIEF DESCRIPTION OF THE DRAWINGS

Reference is now made to the following descriptions:

FIG. 3B illustrates a table of acronyms and other terms in the following discussion;

FIG. 13 illustrates a Table that shows the improvements that occur with employment of the Akima and "modified Akima" algorithm for determining synchronous samples from asynchronous samples;

FIG. 14A illustrates an augmented least squares ("LS") solver constructed according to the principles of the present Application, using a generic coarse reconstruction scheme for the first step;

FIG. 14B illustrates an augmented LS solver constructed according to the principles of the present Application, using a modified Akima algorithm;

FIG. 17 is a table of the computational complexity of various reconstruction algorithms per output point;

FIG. 18 is a graph of merit of the reconstruction scheme used as part of asynchronous ADC.

DETAILED DESCRIPTION

Figure 1A:
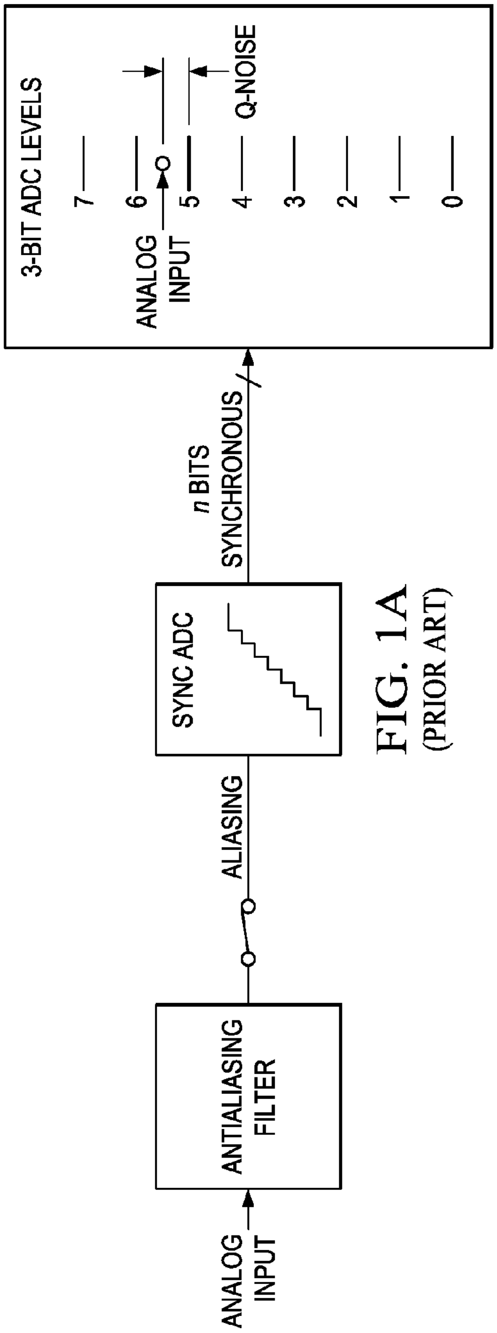
FIG. 1A illustrates a prior art synchronous ADC sampling.
Figure 1B:
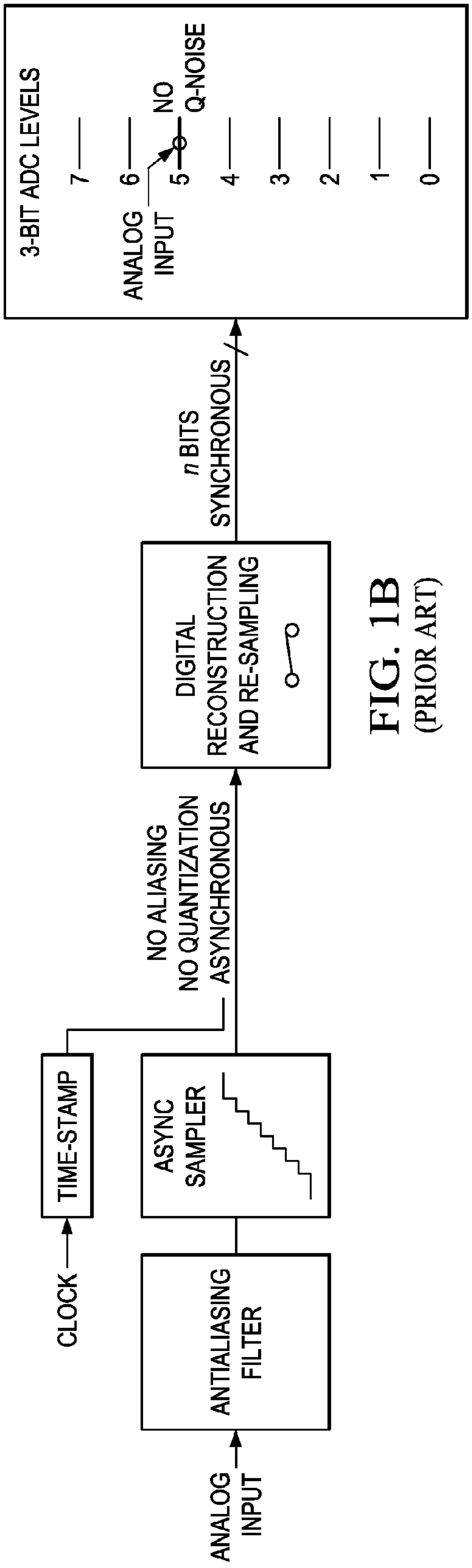
FIG. 1B illustrates a prior art asynchronous ADC sampling.
Figure 2A:
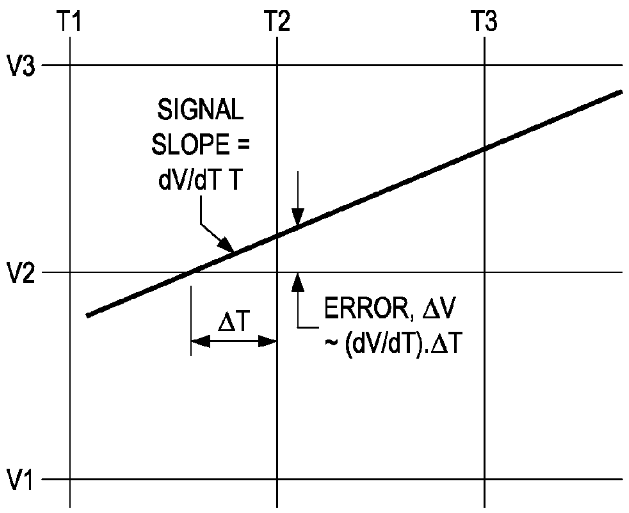
FIG. 2A illustrates an effect of time quantization as it relates to an equivalent voltage quantization as understood by the present inventors.
Figure 2B:
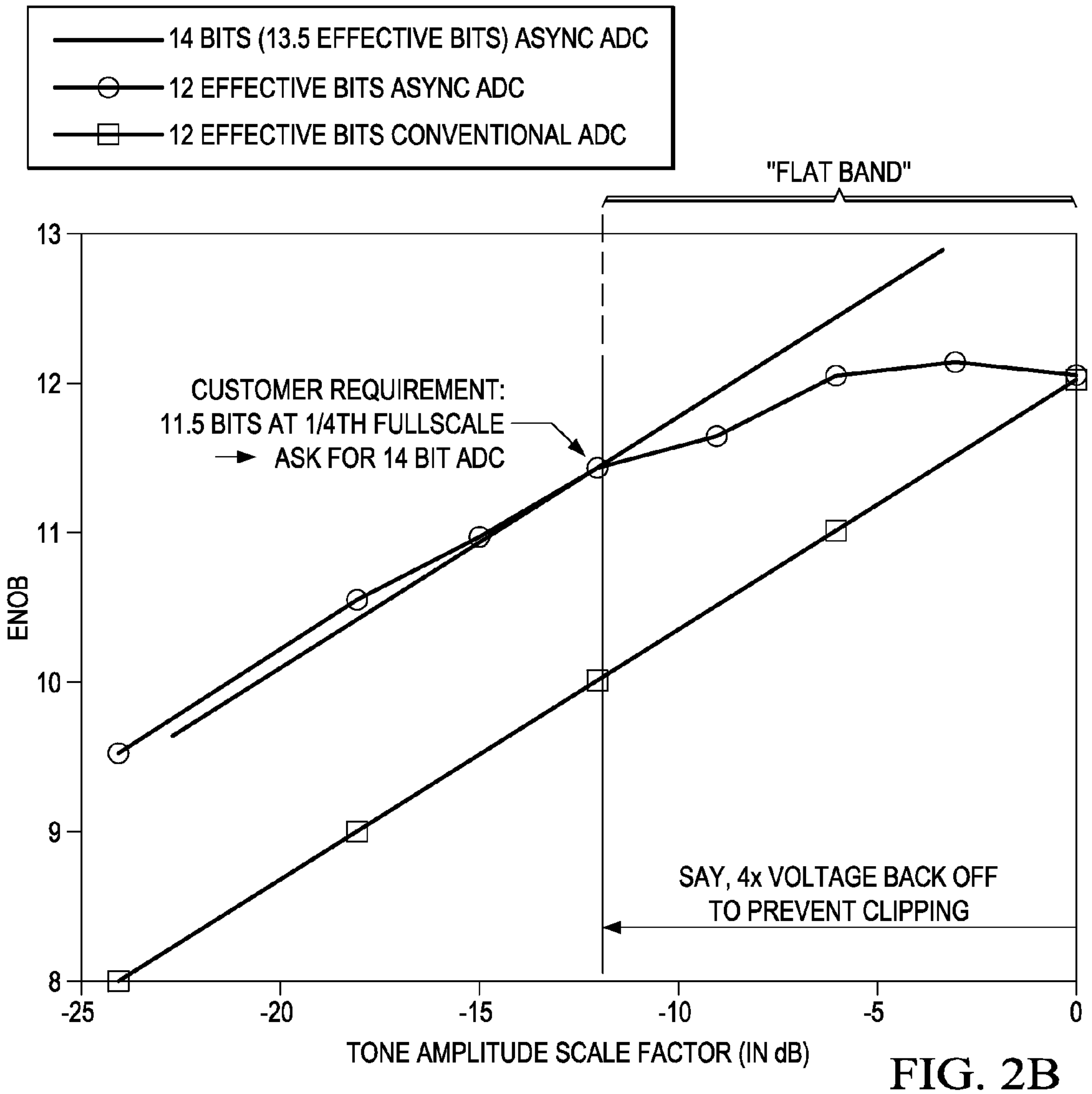
FIG. 2B illustrates a flat band of a 13.5 effective bit asynchronous ADC.
Figure 3A:
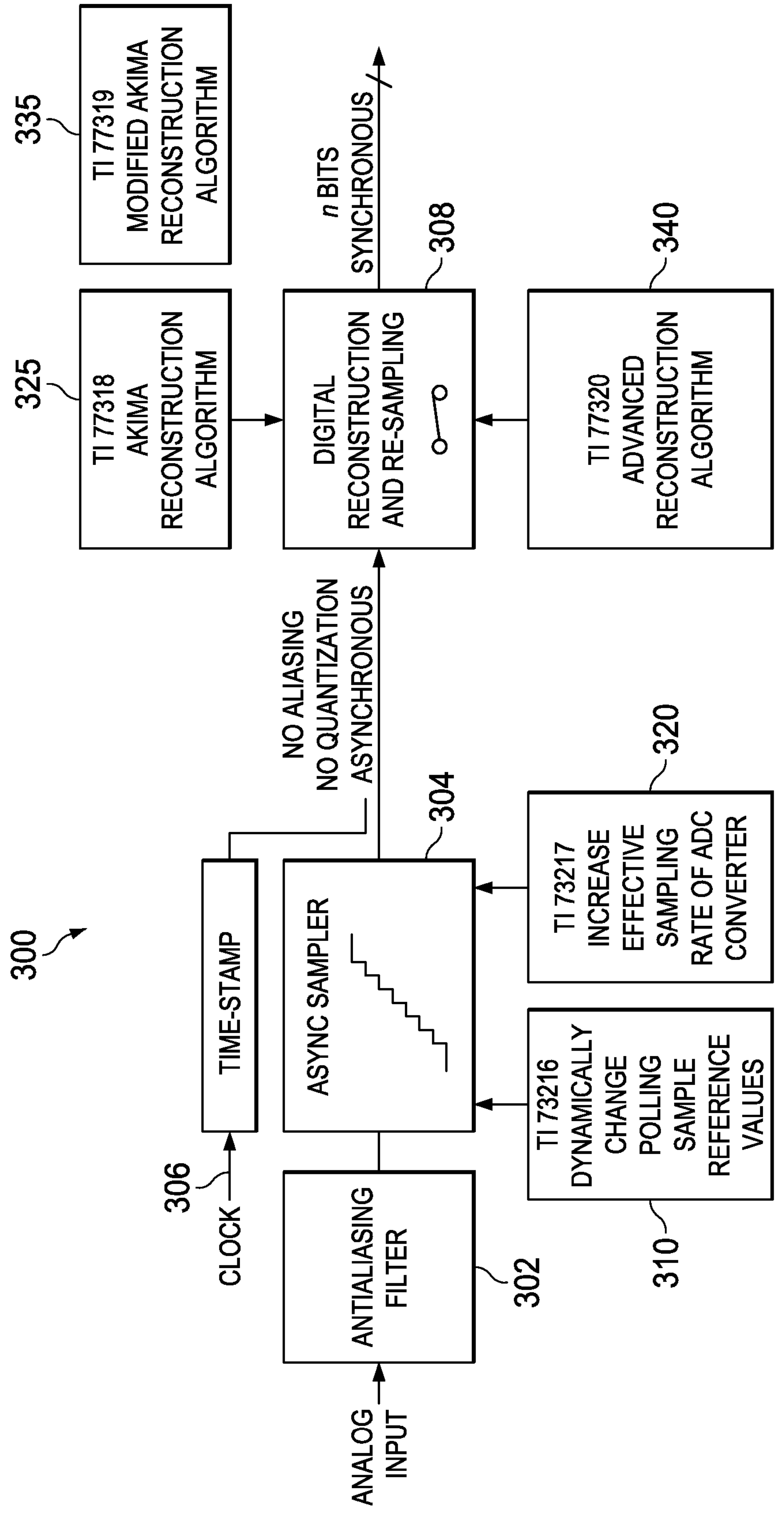
FIG. 3A illustrates an asynchronous ADC constructed according to the principles of the present application.

FIG. 3A illustrates a block diagram of an example asynchronous analog to digital converter (ADC) 300 constructed according to the principles of the present application.

As is illustrated, the asynchronous ADC is preceded by an anti-aliasing filter 302, which receives an analog input. The output of the anti-aliasing filter 302 is coupled to an input of an asynchronous sampler 304. The asynchronous sampler 304 output is time-stamped by the time-stamper block which can be calibrated using an external clock, 306. The time stamped asynchronous outputs (2-tuples) are fed to a digital reconstructor or resampler ("resampler") 308. The resampler 308 receives the asynchronous samples (2-tuples) and creates synchronous digital samples from them.

The asynchronous sampler 304 further includes a polling reference adaptation algorithm 310 which describes a scheme to generate asynchronous samples from a continuous analog signal.

The asynchronous sampler 304 also includes a sample rate control unit 320, which controls the rate of the asynchronous samples. The sample rate is adapted such that it allows for a simplification of a reconstruction algorithm used in the resampler 308. Generally, the asynchronous sampler 304 gives out the asynchronous sample 2-tuples (i.e. a voltage magnitude (level) and a time stamp measurement corresponding to that level crossing).

The sample rate control unit 320 performs this task by performing various predictions as to where the various polling levels of the asynchronous ADC should be placed, that is less than the full range, as shall be described below. By placing the snapout at less than the full range, advantageously the ADC converter 300 can converge to a solution or a timeout in a substantially shorter time.

The digital reconstructor and sampler 308 includes an Akima reconstruction algorithm 325 based on the algorithm described in Akima, H.; "A new method of interpolation and smooth curve fitting based on local procedures, Journal of the Association of Computing Machinery, Vol. 17, No. 4, October 1970, pp. 589-602" which is hereby incorporated by reference in its entirety, a modified Akima reconstruction algorithm 330 and an advanced reconstruction algorithm 340, wherein either the Akima algorithm 325, the modified Akima algorithm 330 or the advanced reconstruction algorithm 340 processes an output from the asynchronous sampler 304. These algorithms are used in the digital reconstructor 308 to generate synchronous digital samples from the asynchronously sampled input signals.

Generally, the present architecture of the asynchronous ADC 300 has been directed towards mitigating two shortfalls of traditional asynchronous ADCs—unwanted oversampling and complex (power hungry) reconstruction from asynchronous 2-tuples to synchronous samples.

Mathematically, it may be shown that for a perfect construction of a signal from sampled data, one needs, on an average, the Nyquist sampling rate of 2B samples per second, where B is the bandwidth of the signal being sampled. These 2B samples may be created synchronously or asynchronously. Therefore, any sampling that occurs more than 2B times per second is an unwanted oversampling.

To convert from asynchronous samples to synchronous samples, there is an interpolation step, wherein performance/power of which also depends on the amount of samples per second. A purpose of the resampling that occurs with this asynchronous ADC 300 is directed towards satisfying two major areas, while minimizing overall power: a) the sampling should ideally be reduced to a minimum, which in this case is as close to 2B times per second as possible, and secondly the asynchronous sampling should be such that the accuracy obtained after the asynchronous to synchronous conversion meets the ENOB requirements. In traditional asynchronous ADCs, the more analog input levels that are used by the sampler, the more digital samples that are generated FIG. 3B illustrates a table of acronyms and other terms in the following discussion.

Figure 4:
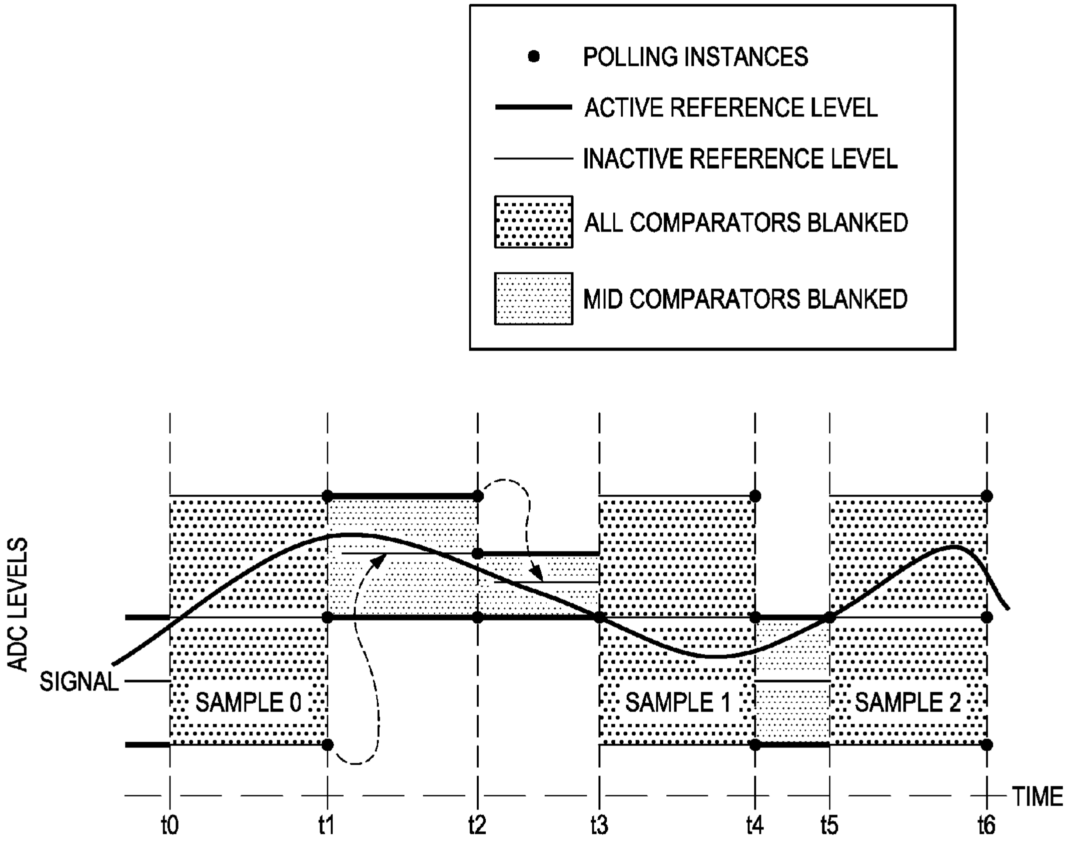
FIG. 4 illustrates a scheme for setting voltage "rail" voltage levels within an asynchronous ADC according to the principles of the present application.

FIG. 4 illustrates a new approach to asynchronous analog conversion,—it is a binary search algorithm similar to a SAR. This approach is manifested in the dynamic polling reference changer 310.

In FIG. 4, the x-axis is time and the y-axis is reference levels. FIG. 4 illustrates a 3 comparator search strategy, but it can be extended to more comparators, thereby getting a faster asynchronous rate of sampling, at the cost of higher power. Please note that the analog input signal is a band-limited signal.

Except for the initial blanking period when all three comparators are inactivated at time t0 (indicated by the gray box), at all other times two of the comparators are "active"—i.e. their outputs are reliable and can generate asynchronous samples if the analog input signal crosses their reference level.

On the other hand, the third comparator (and all three comparators during the initial blanking period) undergoes a reference level change at every polling instant, and is also declared inactive (i.e. their output is unreliable and is masked) during the blanking period which follows. Thus, the two active comparators are used to generate the asynchronous samples and the third comparator is used to help in tracking the signal, as shall be discussed below.

The asynchronous samples in FIG. 4 are indicated by black dots. Every time a black dot occurs, and the asynchronous sampling occurs—the references of all the comparators are changed (they are moved away from the signal level, i.e. "snapped" out) and then they go into the blanking interval, so as to be able to "capture" the next asynchronous input signal. During this blanking time, the comparators are allowed to settle and the outputs cannot be considered reliable.

At the end of the blanking period, t1, the comparator outputs are reliable; they are used to poll the signal—to determine which half contains the signal.

Then the 2 outer comparators in the correct half are kept active—while the reference of third comparator is moved to bisect the top half to be inserted between the two levels wherein the signal lies. However, this interposed third comparator which has just seen its reference level change, is temporarily kept inactive, i.e. cannot produce samples. During this time if the signal crosses the outer levels, an asynchronous sample is created. Otherwise, after another polling period, the comparators are flashed again and the process is repeated.

So as can be seen, after the initial blanking period, only the mid-comparators are allowed to move and only its reference needs to be blanked—but the signal is always trapped by the outer level comparators. Also after every blanking period—the search space is halved by the interposing voltage comparator so as to reduce the separation to 1 LSB in a given amount of time.

As can be imagined, a fast moving signal will cross the reference levels quickly—while a slow moving signal might take a number of steps. Therefore, in a further aspect, the snapout after a sample can be increased for a fast moving signal, and reduced for a slow moving signal—to control the sampling rate.

Prediction Algorithm

The reference levels for the asynchronous sampling can indeed be driven by a prediction algorithm, which modifies thresholds, and the probability of such crossings, based on local characteristics of the signal. For example, the reference levels could be placed at various places other than mid-way, based on such factors as a predicted behavior of the analog input signal, and so on.

Apart from changing the manner in which the reference levels are chosen, another way to change the sampling rate of such an ADC, is to use a higher number of comparators. There are a number of straightforward extensions of this scheme, where more than three comparators may be used along with signal slope or other parameters, so as to change the sampling rate of this ADC.

For example, if there are N comparators used, then theoretically the polling snapout algorithm can be implemented in which the successive range between the "rail" comparators between every polling interval is reduced by a factor (N−1) until the range reduces to "m" (where m is small integer) LSBs. The "rail comparators" can be defined as the comparators which are used to bound an analog signal between two levels. The "outer rail comparators" are the maximum allowable voltage comparison levels of the asynchronous ADC 300.

Another aspect of this converter is how it handles DC or low frequency signals. For certain such signals, even after KT seconds (where K is a constant less than or equal to 1 and T is the Nyquist frequency of the signal frequency)—the signal may not cross a static reference level. To ensure that the voltage quantization noise is minimum, the signal range spanned by the outer comparators is progressively reduced over the KT seconds, till the separation between the active comparators is only 1 LSB. If an asynchronous sample is not generated within this time period, a sample is forced with ½ LSB of voltage quantization noise—similar to a synchronous ADC. This is equivalent to configuring a time out, $T_{out}$ equal to KT seconds, whereby a sample is forced at every time out if an asynchronous sample is not produced before that. The forced sample is deemed to have voltage level equal to the mid-level between the two levels bounding the input signal.

Escaping Signals

Also note that there is a possibility for the signal to escape during the initial blanking time, and in this situation, the outer comparators are programmed with voltage levels corresponding to one of the rail voltages of the ADC and the minimum or maximum of the current reference voltage levels according to the direction in which signal has escaped—and after paying the penalty of one extra polling period, the signal can be recovered.

If the signal has escaped in the positive direction (all the comparator outputs are low), the upper rail of the ADC and the maximum of the current reference levels are taken as the bounding reference levels. If the signal has escaped in the negative direction (all the comparator outputs are high), the lower rail of the ADC and the minimum of the current reference levels are taken as the bounding reference levels. In the case of an escape event, after setting the reference levels which bound the analog input signal, the regular process of reducing the voltage range between the rail comparators is followed until one of the rail comparators is crossed or time out happens for a new sample creation.

Timeout

To ensure that at least the minimum number of samples are produced for all signal frequencies and amplitudes, the concept of timeout is used. This ensures that the asynchronous ADC produces Nyquist rate (2B) samples for low frequency/DC signals even if it lies between two adjacent reference (DAC) levels. The timeout is typically set at "KT" seconds where "K" is a scaling constant (K<=1) and T is the Nyquist time interval of the signal (T=1/(2B)). If no level crossing occurs before the time out period, a sample is forced in the middle of the two reference levels which bound the input signal.

Figure 5I:
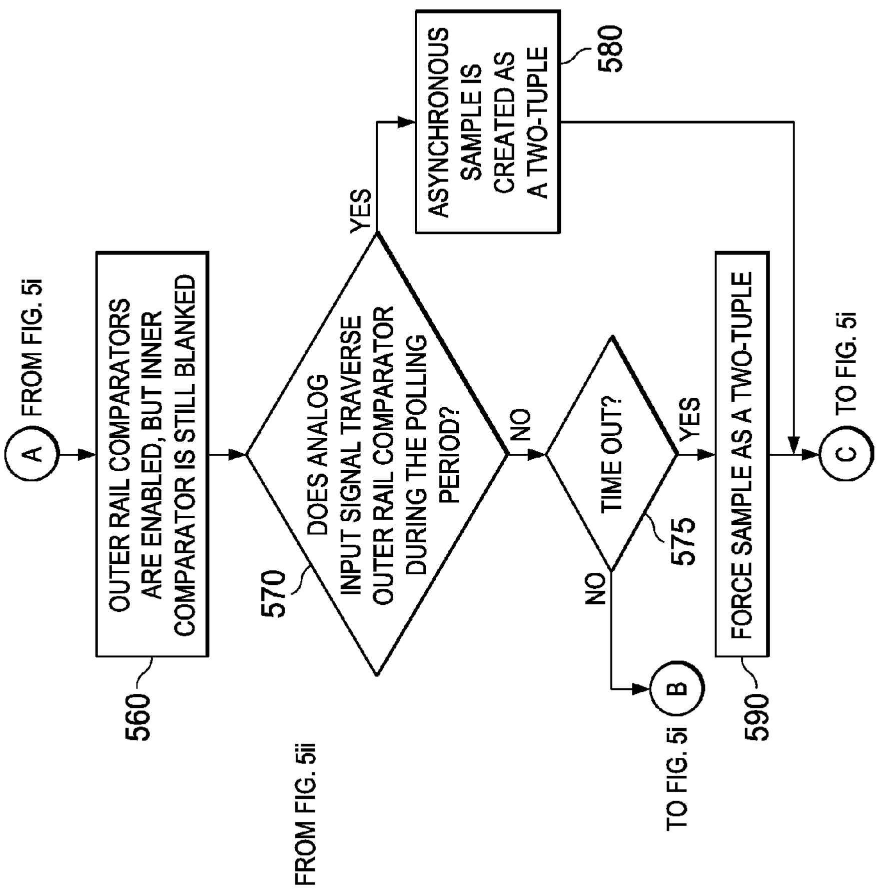
FIGS. 5*i* and 5*ii* illustrates a method for setting voltage "polling" voltage levels with the asynchronous ADC of FIG. 3A.
Figure 5I:
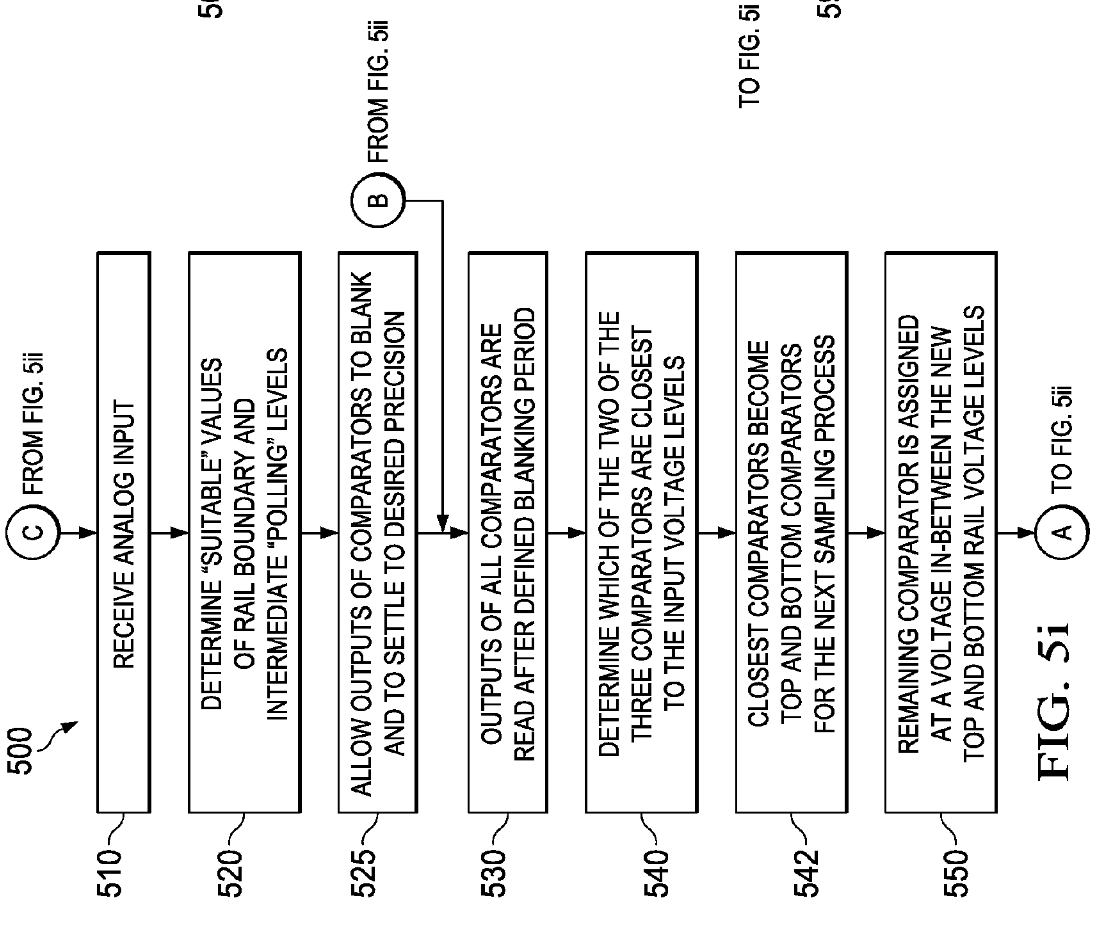

FIGS. 5Bi and 5Bii illustrates a method 500 for setting the "rail" references of the asynchronous ADC of FIG. 3A. This is a method of tracking an analog signal and generating accurate asynchronous samples using a multitude of comparators, each using its own dynamically assigned unique reference level. Each time an asynchronous sample is created, the outermost comparators are widened ("snapped") back to a predefined position, and the widening is also called "snap-out" in this document.

In one aspect, the widening occurs to the maximum range allowable, or even to the voltage rails. In another aspect, the widening could be less than an allowable maximum range, and could be determined based on the characteristics of the signal. In this document, this is referred to as "adaptive snapout", and will be discussed in more detail below. Please note that the method 500 may be read in concert with FIG. 4.

In a step 510, analog input is received by the asynchronous ADC 300.

In a step 520, the asynchronous sampler 304 of the ADC 300 determines the "suitable" values of outer comparators, at time t0, and inner polling comparator level, also at t0. Suitable can be generally derived as the extreme voltage rails, or can be based on prior behavior of the input signal, as shall be discussed in more detail below, in "Adaptive Snap-Out".

In a step 525, between time t0 and t1, all three comparators are blanked, and the outputs are allowed to settle to the desired precision. During this settling period, the outputs are not considered reliable, and therefore not used.

In a step 530, at a time t1, after the defined blanking period, outputs of all three comparators are read. This is also called the "polling" step.

In step 540, and also which at time t1, it is determined which two of the three comparators are closest to the input voltage levels.

In a step 545, these two closest comparators then become the new outer (top and bottom) comparators for the next sampling process.

In a step 550, also at time t1, the remaining comparator is assigned a reference voltage level that bisects, or otherwise lay somewhere in between, the new top and bottom rail voltage levels.

In a step 560, the newly-defined outer comparators are deemed ready to sample (i.e., are "active" between times t1 and t2). However, during this time, the inner comparator whose reference has been changed at time t1 is inactive, and allowed to settle.

In a step 570, between t1 and t2, the asynchronous ADC 300 is checking whether the analog input signal crosses one of the outer rail comparators. If not, the method 500 advances to step 575. If so, the method 550 advances to step 580.

There is a possibility that the input signal continues to lie between two adjacent DAC levels for an extended time period and hence asynchronous samples would not be created by the process defined above. In such situations, as is illustrated in step 575, the ADC 300 tests for a "timeout" wherein it is determined if a specified time has passed beyond which a timeout period would have occurred. If a time out has not occurred, step 575 returns to step 530. If it has occurred, step 575 goes to step 590.

In a step 580, at time t3, the input voltage level crosses the reference of one of the active comparators, thereby producing an asynchronous sample. Note that the asynchronous sample is a 2-tuple having voltage level and a time stamp. The voltage level is equal to the reference level which was crossed by the input signal while the timestamp corresponds to the time at which the crossover takes places. In reality, the time stamp corresponds to the quantized value of the time. Step 580 then returns to step 510.

In a step 590, there is a forced sample of output samples, such as with a voltage levels in-between [such as midway] the two DAC values.

In a further aspect of the method 500, an intermediate or in between reference value can be further elegantly extended to use n comparators, wherein "n" is greater than three, and wherein two of the comparators remain as the outer comparators, and [n−2] of them become the inner comparators.

Should this occur, in every polling period, [n−2] comparators become inner comparators and are assigned values in between the upper and lower comparators.

Note that as an asynchronous converter computing new reference levels using the snap-out values, we may create levels that are hypothetically beyond the allowed range. Should this occur, the new reference levels need to be created, by saturating the reference level to the maximum extremities of the allowed range. In other words, the range is extended only to the voltage rails, but not beyond.

For example, if the DAC level span the ranges 0-4095, and the last sample is created at DAC level 4000 with a snap out of 256, the new outer levels would be created as 4000−256=3744, and 4095. Now, should this occur, in the three converter case, the inner comparator which was programmed at the mid-point and would sit at 3920.

Adaptive Snap-Out

The method 500 discussed above uses three or more comparators with their own reference level. Each time a sample is created, the outer-most comparators are widened back to predefined positions; as mentioned earlier, the widening is called "snap-out". In other words, if the trigger comparator had a reference DAC level L, after sample creation the outer comparators have levels L−Δ, L+Δ respectively, wherein A the snapout value.

This application now introduces the concept in greater detail of "Adaptive snapout" can be generally defined wherein the extent of the snapout is adapted to the signal characteristics. This can mean that the widening does not occur to the maximum range allowable (i.e. the rails), but can be, for example, "adaptively snapped back" to a smaller range within the rails. The value of snap out Δ is adapted over time, in order to improve the sampling rate. The adaptive snap out can be embodied, for example, in the sample rate control unit 320.

In contrast to the sampling schemes described in the previous section of method 500, the snap out value can be adaptively varied to track the input signal characteristics, thereby increasing the average sampling rate when compared to the sampling rate obtained by using fixed snapout value in the baseline adaptation scheme described above. The next few sections describe various adaptation techniques.

In a further aspect, the "snap-out" could use a "slow adaptation" which tracks the macro-characteristics of the signal, e.g., amplitude, frequency, etc. In addition, the ADC 300 could be using a "fast adaptation" which tracks the micro characteristics of the signal, such as local quiescence periods, or peaks.

Figure 6A:
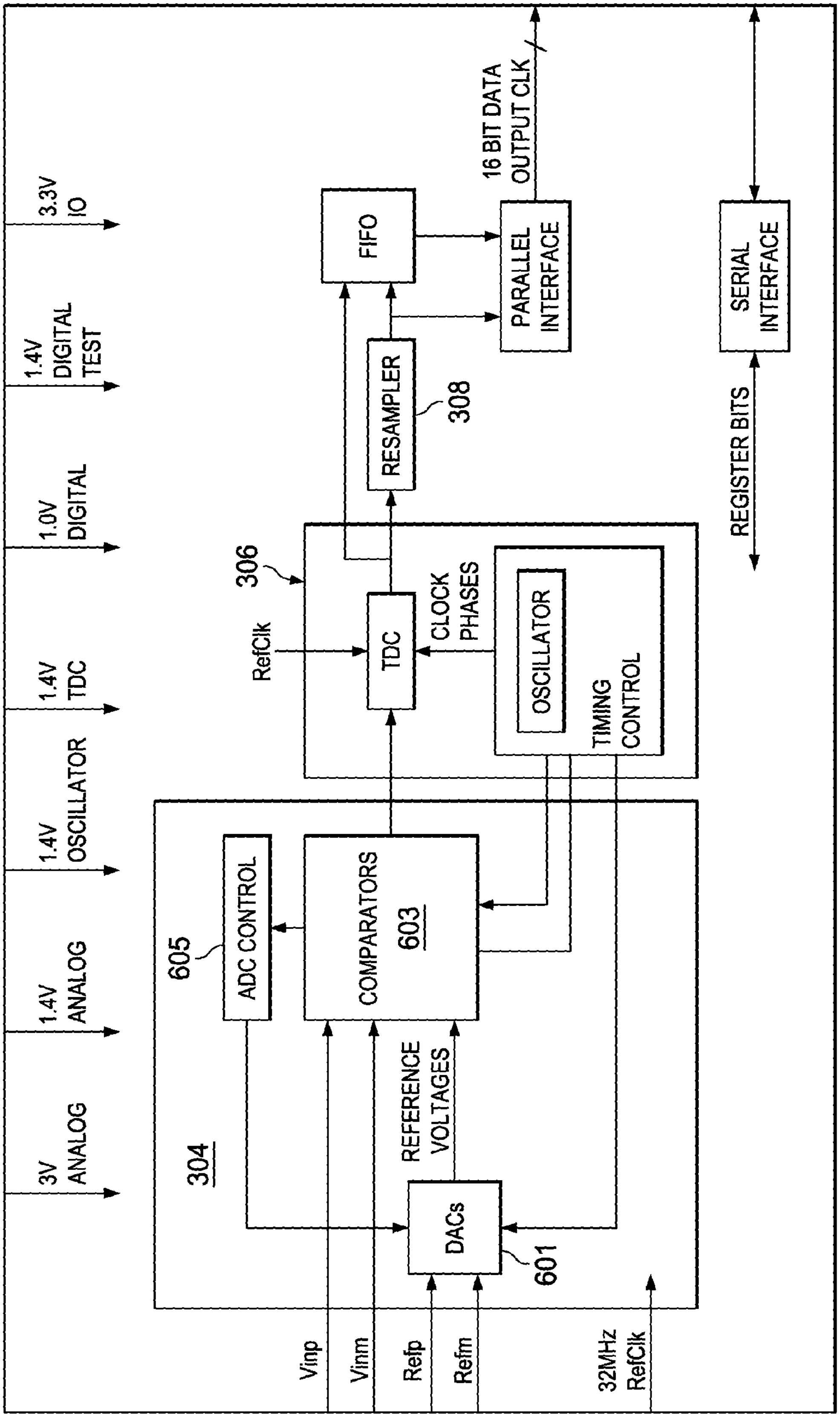
FIG. 6A illustrates a block diagram of an asynchronous ADC designed according to the principles of the present application.

Turning to FIG. 6A, illustrated is an example of the asynchronous ADC 300 constructed according to the principles of the present Application.

As is illustrated, the asynchronous sampler 304 includes DACs 601, coupled comparators 603, and the ADC control 605, which controls the DACs 601. Generally, the ADC control 605 dynamically adjusts the DAC reference thresholds so as to control snapback values. Please note that the asynchronous ADC converter includes the clock 306 and the resampler 308.

Figure 6B:
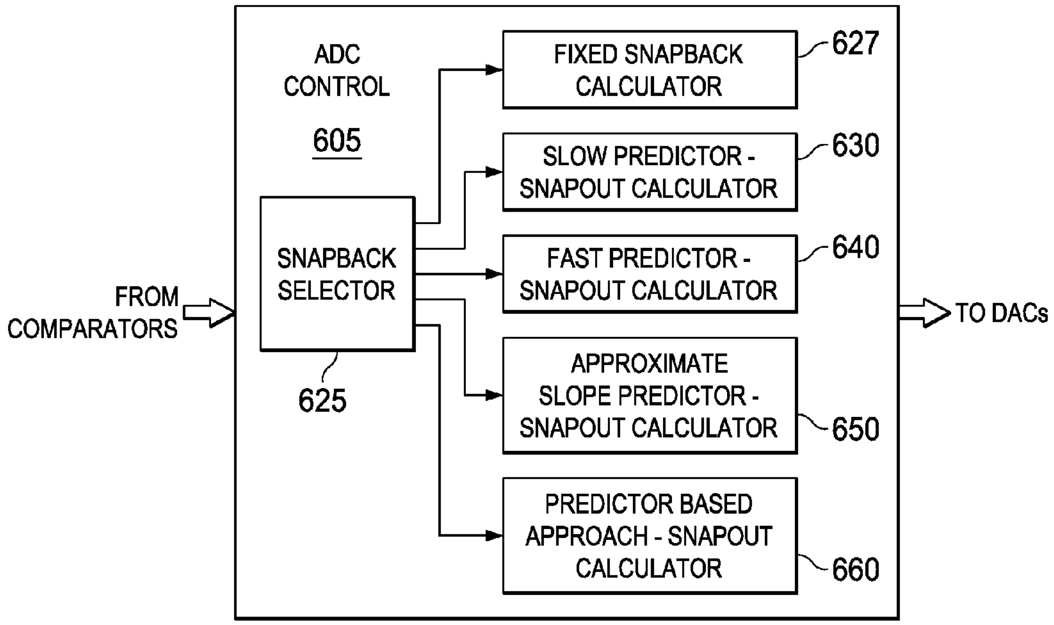
FIG. 6B illustrates a snapback selector of the snapout controller of FIG. 6A constructed according to the principles of the present application.
Figure 7:
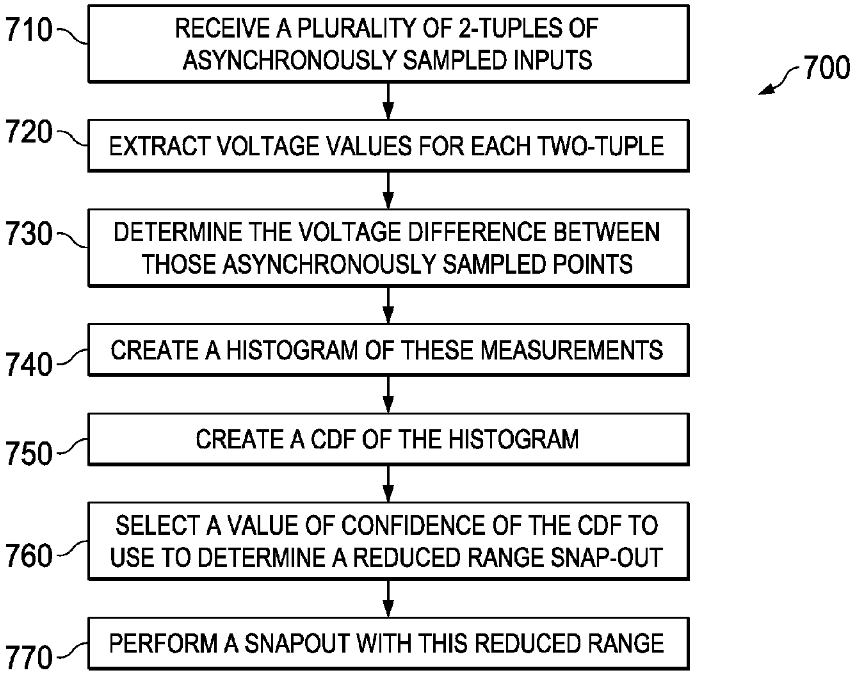
FIG. 7 illustrates a first example method flow for determining a reduced snapout range for an asynchronous ADC constructed according to the principles of the present application.

FIG. 6B illustrates the ADC control 605 in more detail. The ADC control 605 includes a snapback selector 625.

Comparators 603 are dynamically assigned various voltage reference values, as discussed in method 500. The method 500 can be controlled by the ADC controller 605. The ADC control 605 includes a fixed snapout predictor 627, a slow predictor—snapout calculator 630, a fast predictor—snapout calculator 640, an approximate slope predictor snapout calculator 650, and a predictor based approach snapout calculator 660.

The fixed snapout calculator 627 implements snapback without dynamically changing the snapback range Slow Adaptation: Histogram Method In the approach implemented in the slow predictor 630, first a histogram, and then the cumulative distributive function CDF, $F_x(x)$ of the voltage difference between successive asynchronous samples are computed.

In other words, as is illustrated by the method 700, first, in a step 710 a plurality asynchronous 2-tuples are measured and stored for each of the asynchronously sampled inputs.

Then, the voltage measurement of each of these 2-tuples is extracted in a step 720.

Then, the voltage difference is between those consecutive asynchronously sampled point is determined in step 730.

Then, a histogram of this information is created in a step 740.

And then the cumulative distributive function CDF, $F_x(x)$ of the voltage difference between successive asynchronous samples is computed in a step 750.

In a step 760, a user selects a confidence range of the snapout value,

In a step 770, the snapout value is employed with the asynchronous ADC converter to define an adaptive snapout range after a sampling has occurred. This snapout range may often be less than a fully allowable snapout range.

Generally, the snapout value $\Delta_{slow}$ is taken as the value which covers a large portion (say 99%) of the histogram, as represented by the CDF. That is, $F_x(x<\Delta_{slow})=0.99$, where $F_x(x)$ denotes the cumulative (probability) distribution function (CDF). The histogram is computed only after a large number of asynchronous samples are accumulated, so as to ensure that they represent the long-term signal statistics accurately. Since the CDF is relatively stable, the value of $\Delta_{slow}$ is only updated only infrequently. Hence, such an adaptation scheme can track slowly changing/unknown parameters like signal bandwidth or signal amplitude.

Fast Adaptation—Scaled Previous Snapout Approach

Figure 8:
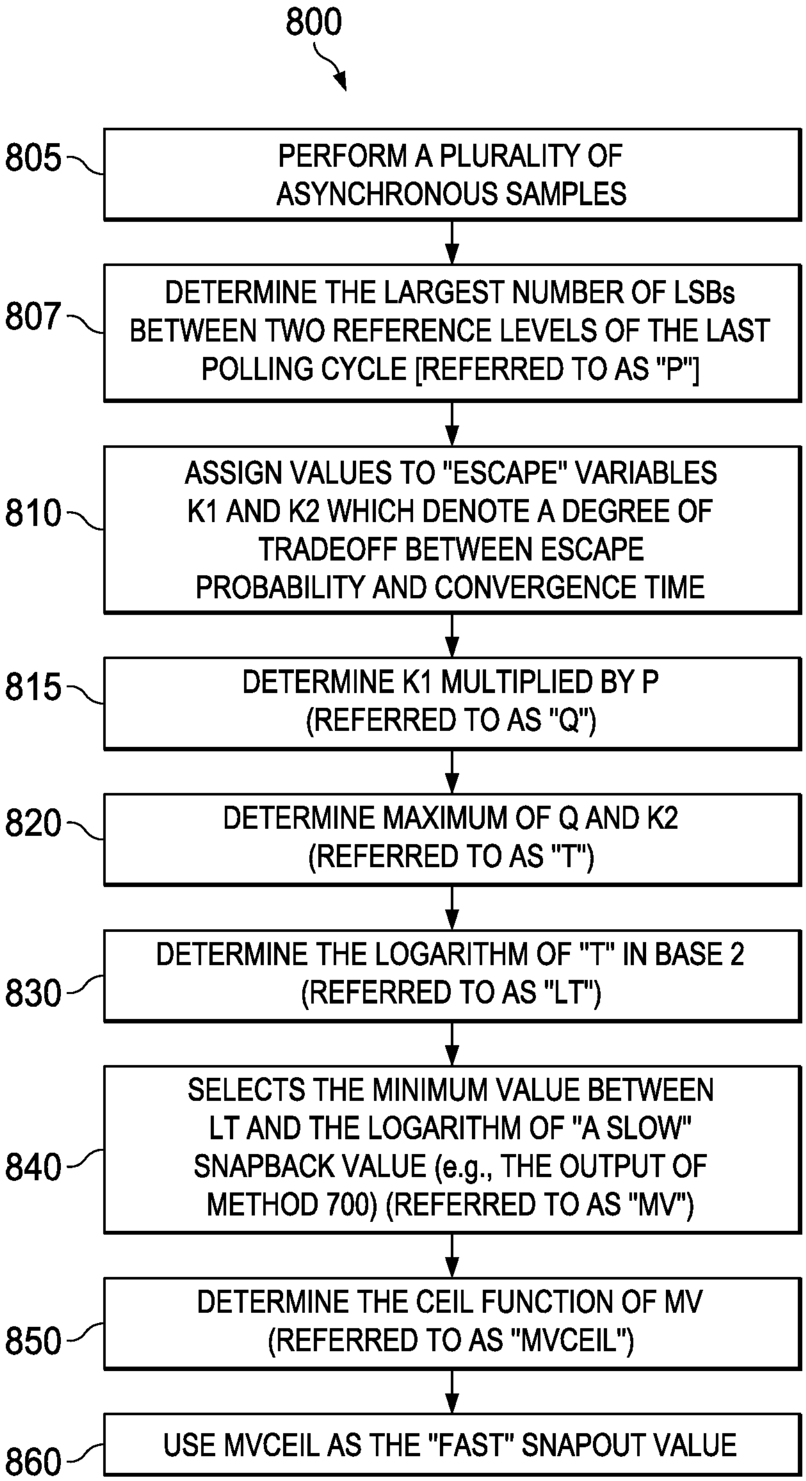
FIG. 8 illustrates a second example method flow for determining a reduced snapout range for an asynchronous ADC constructed according to the principles of the present application.

As will be described in the method 800 of FIG. 8, apart from the value ($\Delta_{slow}$) from the slow adaptation loop as described above, the value of snap out Δ can be changed based on local statistics (like instantaneous signal slope, previous snap out value, etc). This is referred as $\Delta_{fast}$ to distinguish from the slow adaptation value $\Delta_{slow}$, If such adaptation can be done accurately and aggressively from sample to sample, the output sampling rate can be increased. Employing such a "fast adaption" scheme will be given below, as employed in the fast predictor snapout calculator 640.

As discussed above, after every sample, there is a blanking period after which the two outermost reference levels become active. From the end of the initial blanking period till the time that the next sample is generated, the method 500 algorithm ensures that the reference levels are reduced over time without ever losing the signal.

However if an "adaptive snapout scheme" is too aggressive, there is possibility that the signal escapes during the initial blanking period itself (i.e., the analog input signal is not bounded by the outer comparators.)

Hence, the snapout adaptation algorithms needs to strike a balance between the number of escape conditions (since signal moves faster when compared to the range covered by the rail comparators due to smaller snapout) and the number of level crossing samples (which reduces when the snapout is too large). On the extreme, when the snapout values are too large (say rail voltage of the input signal), time outs may occur which reduces the average sampling rate.

The following equation gives one approach for calculating the snapout after the nth sample that represents this balance. Assuming that $\Delta_{slow}$ is a power of "2", $$\Delta_{fast}^{\,n+1}=2^{\lceil log2(min(max(k_1 p,k_2),l\Delta_{slow}))\rceil},$$

where p=maximum difference (in LSBs) between successive reference levels when the sample is created. Note that the reference levels may be distributed non-uniformly for a given sample at a given time, and hence the maximum difference between levels is used for p. Also $$l\Delta_{slow} \triangleq \log_2(\Delta_{slow}); k_1, k_2 >= 1.$$

Note that, the parameters $k_1$, p and $k_2$ can be chosen to provide a good tradeoff between maximizing the sampling rate and minimizing the signal escape probability. Note that $\Delta_{fast}^{\,n}$ is bounded between $k_2$ and $\Delta_{slow}$.

Using this scheme, slow-moving signals (p≅1), initially generate samples at a slower rate resulting in smaller snapouts which in turn increase the sampling rate. In contrast the faster moving sections of the signal initially produce larger values of p and faster samples, but the resulting larger snap outs, result in lower sampling rates but minimize the probability of losing the signal. Thus this scheme adapts differently to the fast and slow moving sections of the signal.

This can also be expressed in the method 800.

In a step 805, a plurality of asynchronous samples are generated.

In step 807 the largest number of Least Significant Bits (LSBs) between two reference levels of the past polling cycle ["referred to as 'p'].

In a step 810, assign values to escape variables $k_1$ and $k_2$ which denote a degree of tradeoff between escape probability and convergence time;

In a step 815, determine $k_1$ multiplied by p (now referred to as "q".)

In a step 820, it is determined what is the maximum value q and $k_2$ (referred to as "t");

In a step 830, it is determined what the logarithm of this value ("t") is in base 2. This value is called "lt".

In a step 840, the method 800 selects the minimum value between this calculated value and the logarithm of "a slow" snapback values (e.g., the output of method 700) (the minimum value referred to as "mv").

In a step 850, after the minimum value is selected, the Ceil function of "mv" is determined (referred to as "mvceil").

In a step 860, the value of step 850 is used as the "fast" snapout value to set up for the next sample collection.

In a further aspect, whenever the signal escapes during the blanking period, it can be concluded that the signal is trapped between the positive/negative rail and one of the outermost reference levels, say R.

In such a case, one option is to move the other outer comparator is to the positive/negative rail so as to trap the signal with certainly.

However, a more aggressive option is to instead move the outer comparator some distance between R and the rail, such as moving it to $R\pm 2\Delta_{slow}$, with the sign being determined based on whether the signal is above or below R.

Fast Adaptation—Approximate Slope Approach

In the approximate slope predictor 350, of the sampler 304 the next snapout value $\Delta_{fast}$ is decided based on the approximate slope of the input signal at the current level crossing sample instant. That is, consider the first order approximation of the derivative of the signal at the current level crossing sample for one of the various scenarios in which the input signal crosses the level which is above the current level.

$$\begin{aligned}
\frac{dV}{dt} &= \frac{x(t_{n-1}) - x(t_n)}{\tau(t_{n-1}) - \tau(t_n)} \\
&= \frac{x(t_{n-1}) - \left(x(t_{n-1}) + snapout_{n-1} \Big/ k^{\left\lceil \frac{\tau(t_n)-\tau(t_{n-1})}{t_{poll}} \right\rceil}\right)}{\tau(t_{n-1}) - \tau(t_n)} \\
&= \frac{-snapout_{n-1} \Big/ k^{\left\lceil \frac{\tau(t_n)-\tau(t_{n-1})}{t_{poll}} \right\rceil}}{\tau(t_{n-1}) - \tau(t_n)} \\
&= \frac{snapout_{n-1}}{k^{\left\lceil \frac{\tau(t_n)-\tau(t_{n-1})}{t_{poll}} \right\rceil}[\tau(t_n) - \tau(t_{n-1})]}
\end{aligned}$$

where k is greater than or equal to one, and where $T_{poll}$ is the time between two consecutive polling time instants.

Generally, although the input signal can cross the same reference level at different time intervals depending on its nature, in general it is true that high slew rate signals cross the immediate levels within short time intervals than the low slew rate signals. This is exploited by setting the next snapout value proportional to the difference between the reference values of rail comparators. That is, if the signal is slow, then it takes more time to cross the levels and hence the difference between the reference values is also small.

On the other hand, for fast moving signals, it crosses the levels within few polling time intervals and hence the difference between the reference values of the rail comparators is large.

Fast Adaptation—Predictor Based Approach

In the fast snapout methods the improvement in the output rate of the asynchronous samples are in the same order since both are based on the approximation of the slope of the signal at the current level crossing sample.

However, to increase this rate further one can employ predictive algorithm to guess where the signal will be based on the past output samples. In this method the next snap out value is calculated based on the output of a predictor at time $\delta_{n+1}$ after the last polling time, as is illustrated in the predictor. As one of the embodiment, a second order predictor is described whose input is the last two asynchronous samples.

Figure 9:
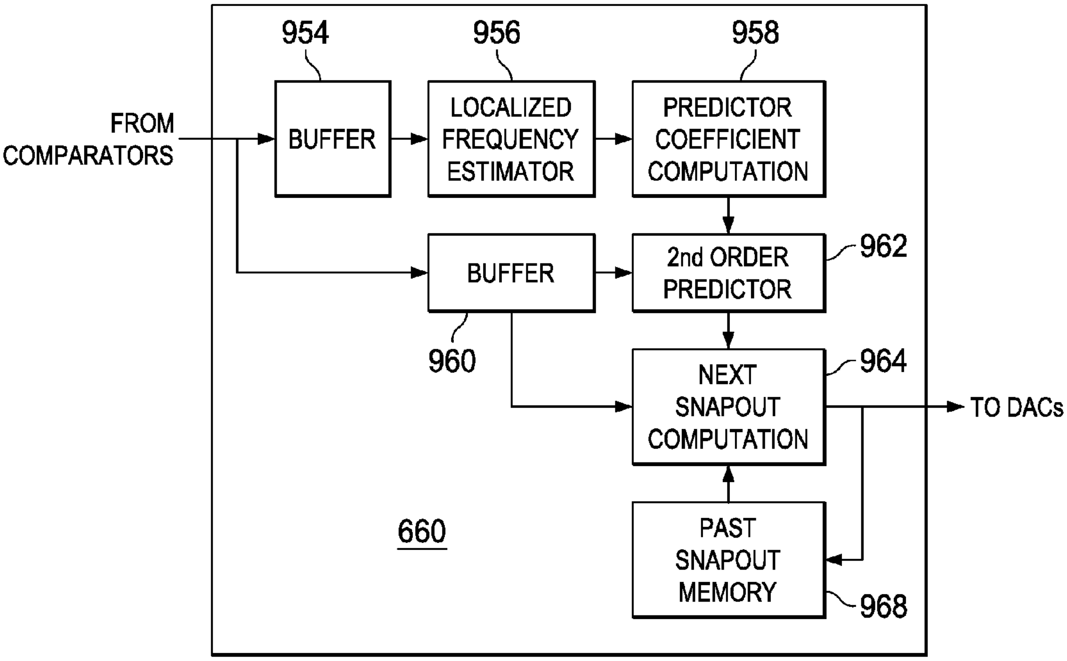
FIG. 9 illustrates the predictor snapout calculator of FIG. 6 in more detail.

This is illustrated in FIG. 9, as embodied of the predictor based approach calculator 660. Depending on the next predicted sample, value we set the snapout in order to maximize the sampling rate and minimize the signal escaping probability.

The predictor calculator 660 includes an input buffer 954, which then conveys the asynchronous samples to a localized frequency estimator 956. The output of the localized frequency estimator 956 is then conveyed to a coupled predictor coefficient computation block 958. The output of this coefficient computation block 958 is then conveyed to the coupled $2^{nd}$ order predictor 962. Also, please note that the asynchronous samples are also conveyed in parallel to a buffer 960, which are then also conveyed to the $2^{nd}$ order predictor 962.

From the $2^{nd}$ order predictor 962, the predicted values are then conveyed to the next snapout computation block 964. The next snapout computation block 964 also receives past snapout values from the past snapout memory 968, and past samples from the buffer 960. Once the calculation is made, the next snapout value is conveyed to the DACs and also stored in the past snapout memory 968.

The localized frequency of the signal in the local frequency estimator 956 is estimated by computing the average of dV/dT from the past samples. Since the sampling instants are non-uniformly spaced, this estimate is smoothened using a low pass filter.

In one of the embodiments, estimated local frequency is computed as $$\hat{f}_n = (1-\alpha)\hat{f}_{n-1} + \alpha\left(\frac{\left[\frac{dV}{dt}\right]_n}{4|V|_{max}}\right)$$

where α is a parameter controlling the window over which exponential averaging is done, dV/dT is the average slew rate of the signal computed as $$\left[\frac{dV}{dT}\right]_{n+1} = (1-\gamma)\left[\frac{dV}{dT}\right]_n + \gamma\left[\frac{x_{n+1}-x_n}{\tau_{n+1}-\tau_n}\right],$$

where γ is a parameter controlling the window over which exponential averaging is done.

The predictor coefficients are calculated as $c_1=2r\cos(2\pi\hat{f}_n\Delta T_s(n))$, $c_2=r^2$, where r=0.95 is assumed, ΔTs (n) is the average time difference between two adjacent samples computed as $$\Delta T_s(n+1)=(1-\beta)\Delta T_s(n)+\beta[\tau_{n+1}-\tau_n],$$

where β is a parameter controlling the window over which exponential averaging is done. The predictor 660 output is given by $$\hat{x}_{n+1}=-c_1x_n+c_2x_{n-1}.$$

The snapout value computed and stored in buffer 960 as $$\Delta_{fast}^{n+1} = \min\left(\frac{\Delta_{fast}^n}{K}, \lfloor |x_n - x_n| 2^B \rfloor\right),$$

where $2^B$ denotes the number of DAC levels supported and $\lfloor x \rfloor$ denotes floor operation and $|x|$ denotes the absolute value and K is a programmable value.

Reconstruction Algorithms

Figure 10A:
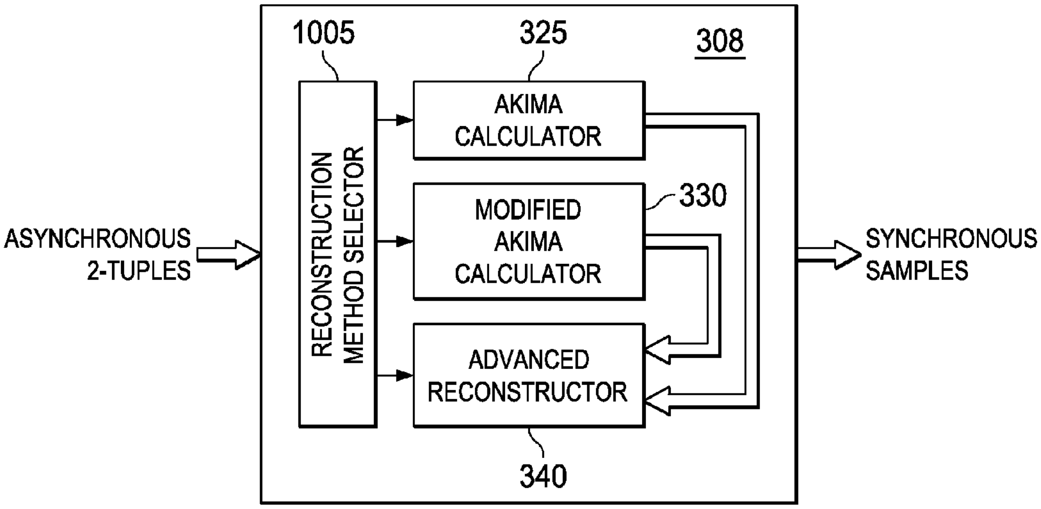
FIG. 10A illustrates an example asynchronous to synchronous calculators of the synchronous digital reconstructor of FIG. 3A.

FIG. 10A illustrates more details of the digital reconstruction and resampler 308. It includes an Akima calculator for reconstructing synchronous samples 325, and a modified Akima calculator 330, and an advanced resconstructor, such as a least squares solver, for reconstructing asynchronous samples 340.

The resampler 308 includes a reconstruction method selector 1005. The reconstruction method selector 1005 selects from the algorithms 325, 330, 340 to select a reconstruction method to generate synchronous samples from asynchronous 2-tuples. Please note that synchronous samples from the Akima calculator 325 or the modified Akima calculator 330 may be fed into the advanced reconstructor 340.

Figure 10B:
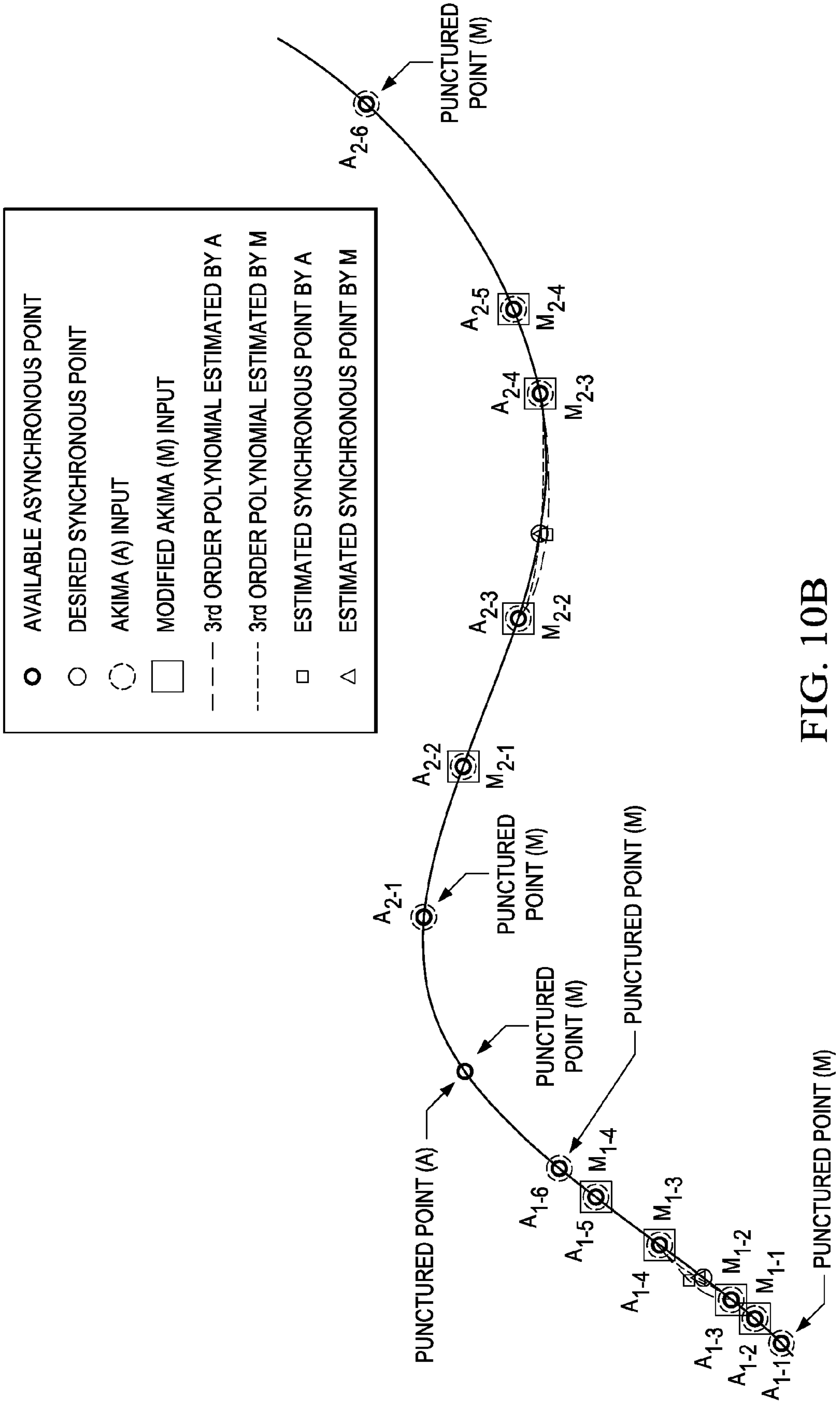
FIG. 10B illustrates a graphed output of an Akima algorithm and a "modified Akima algorithm" that calculates an analog-to digital synchronous signal from the inputted sampled asynchronous signals as calculated in the synchronous digital reconstructor of FIG. 3A.

Turning now to FIG. 10B, illustrated is an example baseline Akima algorithm and its modified version to be used for reconstruction of a synchronous sample in the digital reconstruction and resampler 308 used within the reconstructors 325, 330.

The objective of these algorithms, the Akima algorithm and the modified Akima algorithm, is to reconstruct the original signal, given a set of non-uniform samples from a band-limited signal.

It is known that sinc-kernel based reconstruction can be used to perfectly reconstruct the signal, when the average sampling rate is higher than the Nyquist rate. However such sinc-kernel based reconstruction is computationally infeasible. One way to tradeoff performance with complexity in this scheme is by using truncated sinc kernels, but the method remains computationally expensive.

In the prior art, spline interpolation is another alternative algorithm which allows an attractive performance complexity tradeoff. Improved performance can be obtained, at the cost of higher complexity, by using higher order splines or by increasing the input sampling rate.

However, as understood by the present inventors, at reasonable input sampling rates, the Akima algorithm achieves moderate performance at low complexity. In fact, for moderate performance requirements, the Akima algorithm is lower complexity than truncated sinc reconstruction or even spline interpolation. Moreover, the complexity of the Akima algorithm depends on the output sampling rate and is independent of the input sampling rate, whereas the complexity of the other algorithms are dependent on both the input and output sampling rates.

Using FIG. 10B, the baseline Akima algorithm is explained here. It fits a (different) third order piecewise polynomial function to every region containing an output point using the asynchronous samples created by the asynchronous ADC 330. Please note that the modified Akima algorithm is also illustrated here in this figure, as shall be detailed below.

For baseline Akima calculator, assume that a sequence of input (asynchronous or synchronous) points are available, and the six points around (three on either side) the first (or second) output point are denoted as $A_{1\text{-}1}, A_{1\text{-}2}, \ldots, A_{1\text{-}6}$ (or $A_{2\text{-}1}, A_{2\text{-}2}, \ldots, A_{2\text{-}6}$,) . . . . Other asynchronous points, if any, are naturally punctured, i.e., disposed of Let each of the points of interest, $A_{i,j}$, be represented by a 2-tuple $(x_{i,j}, y_{i,j})$, where i refers to the output index and j=1, . . . , 6 represent the six asynchronous sample indices around it. These six points are used to completely describe the polynomial between $A_{1\text{-}3}$ and $A_{1\text{-}4}$ (the two asynchronous points surrounding the output point) The piece-wise polynomial can be expressed as, $$y(x)=p_0+p_1(x-x_{i,3})+p_2(x-x_{i,3})^2+p_3(x-x_{i,3})^3,$$

so that it satisfies the following conditions, $y(x_{i,3})=y_{i,3}$; $y(x_{i,4})=y_{i,4}$;

$$\left.\frac{dy}{dx}\right|_{x=x_{i,3}} = l_3$$

and $$\left.\frac{dy}{dx}\right|_{x=x_{i,4}} = l_4$$

where $l_3$ and $l_4$ are the slopes of the polynomial at $A_{1\text{-}3}$ and $A_{1\text{-}4}$ respectively.

Solving these equations, the following coefficient values are obtained.

$$p_0 = y_{i,3};$$

$$p_1 = l_3;$$

$$p_2 = \left(3\frac{(y_{i,4}-y_{i,3})}{(x_{i,4}-x_{i,3})} - 2l_3 - l_4\right)\Big/(x_{i,4}-x_{i,3});$$

$$p_3 = \left(l_3 + l_4 - 2\frac{(y_{i,4}-y_{i,3})}{(x_{i,4}-x_{i,3})}\right)\Big/(x_{i,4}-x_{i,3})^2.$$

Note that, the slopes of polynomial at the two endpoints, $(x_{i,3}, y_{i,3})$ and $(x_{i,4}, y_{i,4})$, are given as $$l_3 = \frac{|m_4-m_3|m_2 + |m_2-m_1|m_3}{|m_4-m_3| + |m_2-m_1|}$$

and $$l_4 = \frac{|m_5-m_4|m_3 + |m_3-m_2|m_4}{|m_5-m_4| + |m_3-m_2|},$$

where $$m_j = \frac{y_{i,j+1}-y_{i,j}}{x_{i,j+1}-x_{i,j}}.$$

A straightforward implementation of this algorithm, assuming all divisions are implemented as look-up tables, would need 17 multipliers and 20 adders (ignoring multipliers with constants and table-lookups).

Figure 11:
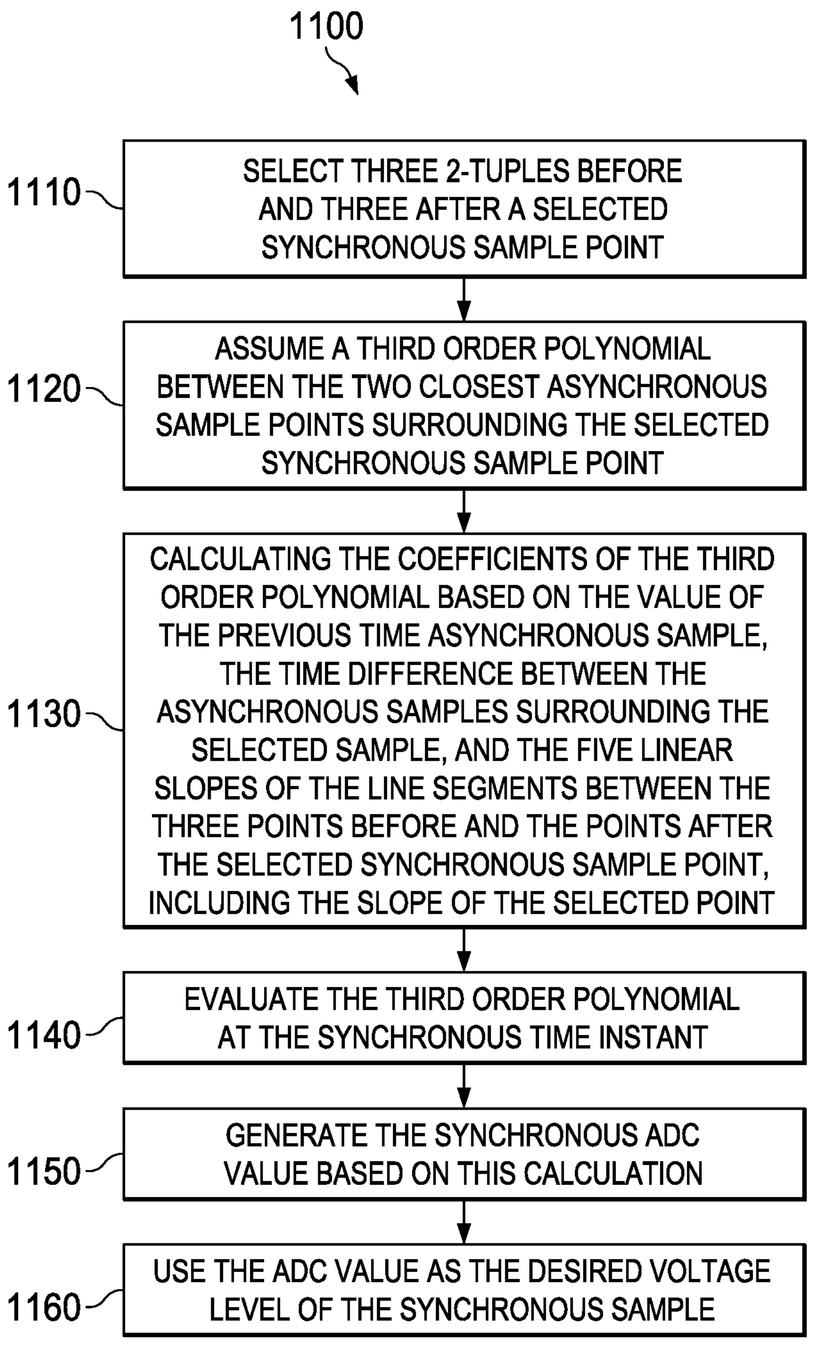
FIG. 11 illustrates an example method for calculating synchronous samples from asynchronous samples according to the Akima approach as calculated in the synchronous digital reconstructor 308 of FIG. 3A.

To restate the above, as implemented in the Akima calculator 325 of the ADC 300, the Akima calculator 325 can generate synchronous voltage samples of the ADC converters according to the flowchart, illustrated by method 1100, as given in FIG. 11.

In a step 1110, select three 2-tuples before and three after a selected synchronous point.

In a step 1120, assume a third order polynomial between the two closest asynchronous sample points surrounding the selected synchronous sample point.

In a step 1130, calculate the coefficients of the third order polynomial based on the value of the previous time asynchronous sample, the time difference between the asynchronous samples surrounding the selected sample, and the five linear slopes of the line segments between the three points before and the points after the selected synchronous sample point, including the slope of the selected point.

In a step 1140, evaluate the third order polynomial at the synchronous time instant of interest.

In a step 1150, generate the synchronous ADC value based on this calculation.

In a step 1160, use the ADC value as the desired voltage level of the synchronous sample, wherein the synchronous ADC value is generated based on this calculation.

Modified Akima Algorithm

As advantageously appreciated by the present inventors, modifications done to the baseline Akima algorithm within another aspect of the asynchronous ADC 300.

The modified version of the algorithm uses four input points (unlike the baseline algorithm which uses six points) around each output point. For example, points $A_{1\text{-}2}, \ldots, A_{1\text{-}5}$ (also denoted as $M_{1\text{-}1}, M_{1\text{-}2}, \ldots, M_{1\text{-}4}$) are used for the first reconstructed point and points $A_{2\text{-}2}, \ldots A_{2\text{-}5}$ (or $M_{2\text{-}1}, \ldots M_{2\text{-}4}$) are used for the second output point. Other asynchronous points, if any, are dropped (punctured) as before.

Apart from using fewer points, various other simplifications were made to the baseline algorithm, resulting in the two versions of the algorithm generating different cubic polynomials and estimated synchronous points.

The exact nature of the changes made to the baseline algorithm is summarized below.

The slope of the polynomial at point $A_{i,3}$, $l_3$, can be written as $$l_3 = \frac{w_1 m_2 + w_2 m_3}{w_1 + w_2},$$

where $w_1=|m_4-m_3|$ and $w_2=|m_2-m_1|$. In this work, the weights are modified as modified as $w_1=|x_{i,4}-x_{i,3}|^n$ and $w_2=|x_{i,3}-x_{i,2}|$ where n is an programmable real number, typically $1 \le n \le 2$. The equations for $l_4$ can also be modified similarly. These modifications are intuitive in the sense that the point closer to the point of interest, gets a much higher weight.

Also as per this modification, only two neighboring points are needed to calculate the slope of the polynomial at each point, as opposed to four neighboring points. Note that, by this modification two multipliers (for each output point) are saved.

Instead of assuming the curve to be expressed as the third order polynomial given in baseline Akima algorithm outlined in the previous section, the following equation may be used:

$$y(x)=p_0+p_1(x-x_{(i,3)})+p_2(x-x_{(i,3)})(x-x_{(i,4)})+p_3(x-x_{(i,3)})^2(x-x_{(i,4)})$$

Putting the curve in the above form is better for fixed point considerations, since higher powers of the difference on one end of the curve are coupled with differences on the other end, thereby reducing overall precision requirements in fixed point. The complexity can be further reduced if the equations are normalized with respect to $(x_3-x_2)$. Note that by doing this, the weight $w_2=1$.

Solving these equations, the following coefficient values are obtained, $$p_0=y_{i,2};p_1=m_{i,3};p_2=(m_3-l_3);p_3=(l_3+l_4-2m_3)$$

For the coefficients, the following quantities are needed, $$l_3m_3=(l_3-m_3)=\frac{w_2(m_2-m_3)}{w_1+w_2}$$

and $$l_4m_3=(l_4-m_3)=\frac{w_2(m_4-m_3)}{w_2+w_3}.$$

The last two coefficients can be rewritten as $p_2=-l_3m_3$; $p_3=(l_3m_3+l_4\,m_3)$. It was also seen that performance can be marginally improved if:

$$l_3m_3=\frac{w_2(k_1m_2-m_3)}{w_1+w_2}$$

and $$l_4m_3=\frac{w_2(k_2m_4-m_3)}{w_2+w_3}$$

where $k_1,k_2$ are constants. Note that since, after normalization, $w_2=1$, $l_3m_3$ (and $l_4m_3$) can be calculated using only 1 addition and 1 multiplication in addition to a table-lookup (ignoring the multiplication with a constant).

Figure 12:
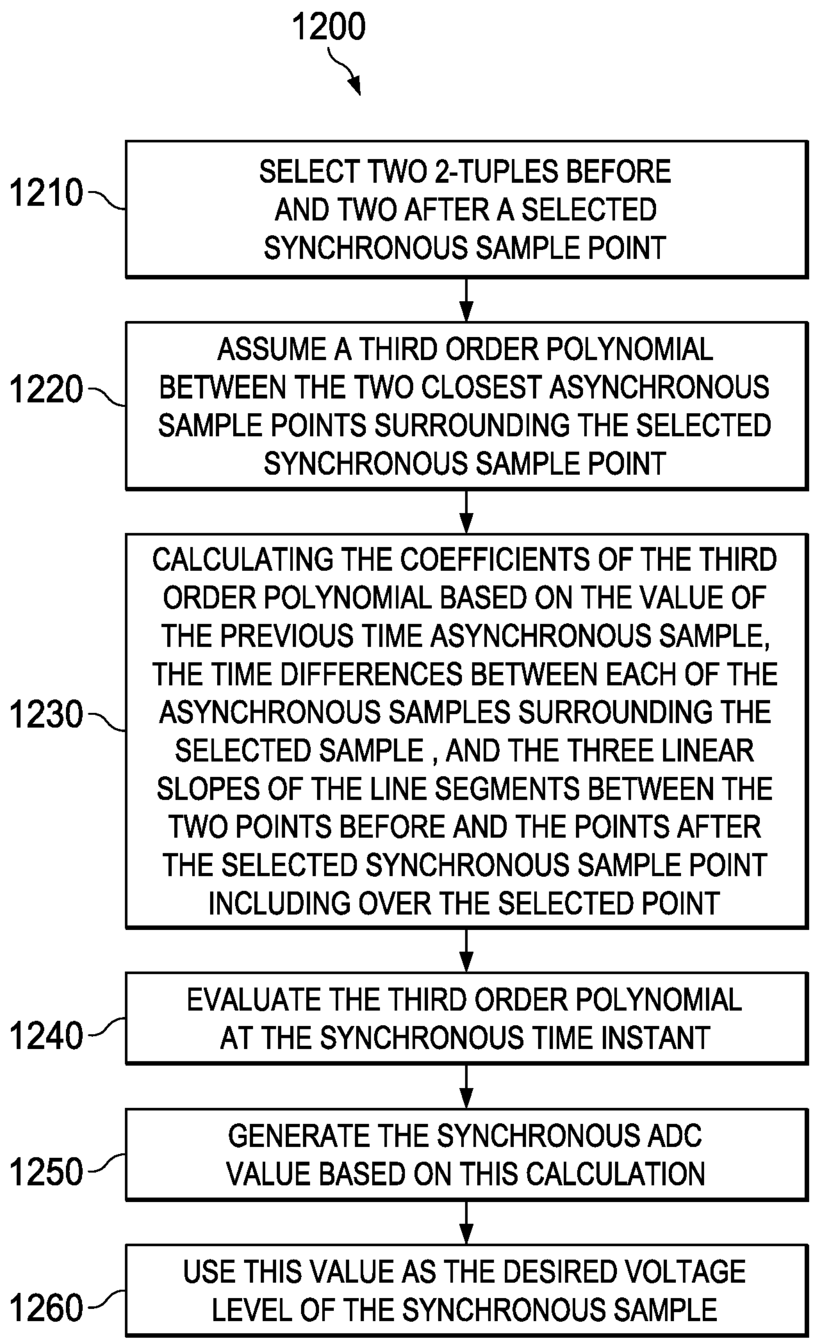
FIG. 12 illustrates an example method for calculating synchronous samples from asynchronous samples according to the modified Akima approach as calculated in the synchronous digital reconstructor of FIG. 3A.

Turning now to FIG. 12, illustrated is a method 1200 that can be embodied in the modified Akima 330, using the modified Akima as described above.

In a step 1210, select two 2-tuples before and two after a selected synchronous sample point.

In a step 1220, assume a third order polynomial between the two closest asynchronous sample points surrounding the selected synchronous sample point.

In a step 1230, calculate the coefficients of the third order polynomial based on the value of the previous time asynchronous sample, the time differences between each of the asynchronous samples surrounding the selected sample, and the three linear slopes of the line segments between the two points before and the points after the selected synchronous sample point including over the selected point.

In a step 1240, the third order polynomial is evaluated at the synchronous time instant.

In a step 1250, the synchronous ADC value is generated based on this calculation.

1260, this ADC value is used as the desired voltage level of the synchronous sample to generate synchronous samples.

FIG. 13 a table that illustrates the numbers of adders and multipliers that can implement the Akima and modified Akima algorithms. For reference, the number of adders and multipliers that can implement the cubic spline algorithm is also shown. As is illustrated, the modified Akima may be implemented with less adders and multipliers than the Akima. Moreover, modified Akima has SNR performance which is very close (49 dB vs. 51 dB) to the cubic spline algorithm. In addition, the Akima algorithm is more hardware-friendly than the cubic spline, which still requires more adders and multipliers to implement.

FIG. 14A illustrates a high level description of a system 1400 of a least squares solver for generating synchronous samples from asynchronous samples.

As is illustrated, a "coarse reconstructor" 1410, such as an Akima reconstructor, receives asynchronous samples in 2-tuple form $(x_i, t_i)$ and converts them into synchronous samples $(y_m)$, where y is the voltage value and m is the synchronous time index. These "coarse" values, as well as the original 2-tuples, are then fed to a least squares solver (LSS) 1420. The least square solver generates the "fine" synchronous values $(z_m)$ using the coarse values, $y_m$, the original asynchronous samples and its own past outputs. The main least squares solver 1420, produces better synchronous estimates, $z_m$ at time-points $n_m$, using the coarse estimates $y_m$. Note that the Least Squares Solver (LSS) 1420 works a few output points behind the Akima engine since it uses Akima outputs, in addition to its own previous outputs.

FIG. 14B illustrates a further aspect of the above. Instead of the coarse reconstructor block, it can use a block implementing the modified Akima algorithm, 1460, which uses the asynchronous 2-tuples to first produce the coarse estimates, $y_m$, and then uses both of these along with the previous outputs from the LSS block, similar to 1400, to produce the refined synchronous estimates $z_m$.

From the sampling theorem, we know that a band-limited signal $f(t)$ can be uniquely reconstructed from the uniformly sampled values, $f(nT_s)$ at sampling freq $F_s=1/T_s$. Note that the uniformly sampled sinc functions are the basis functions for a discrete time domain representation of a band-limited signal.

$$f(t)\sum_{n=-\infty}^{\infty} f(nT_S)\cdot sinc\left(\frac{t-nT_s}{T_s}\right)$$

Figure 15A:
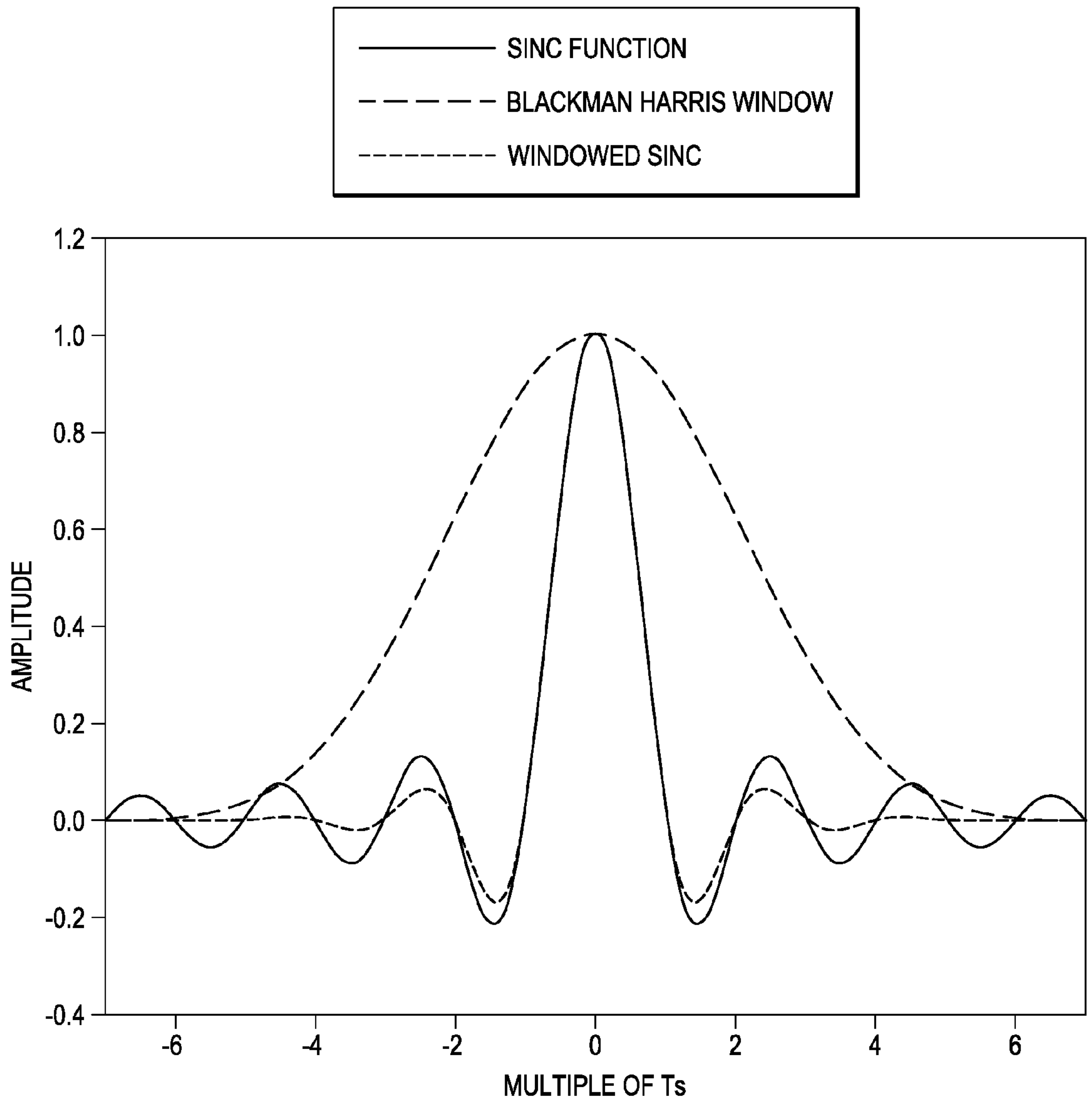
FIGS. 15A and 15B illustrate prior art reconstruction using a sinc function.

This is the convolution of the uniformly sampled values of the function (also called the coefficients) and the sinc functions centered at uniformly distributed sample time-points, as shown in FIG. 15A.

Figure 15B:
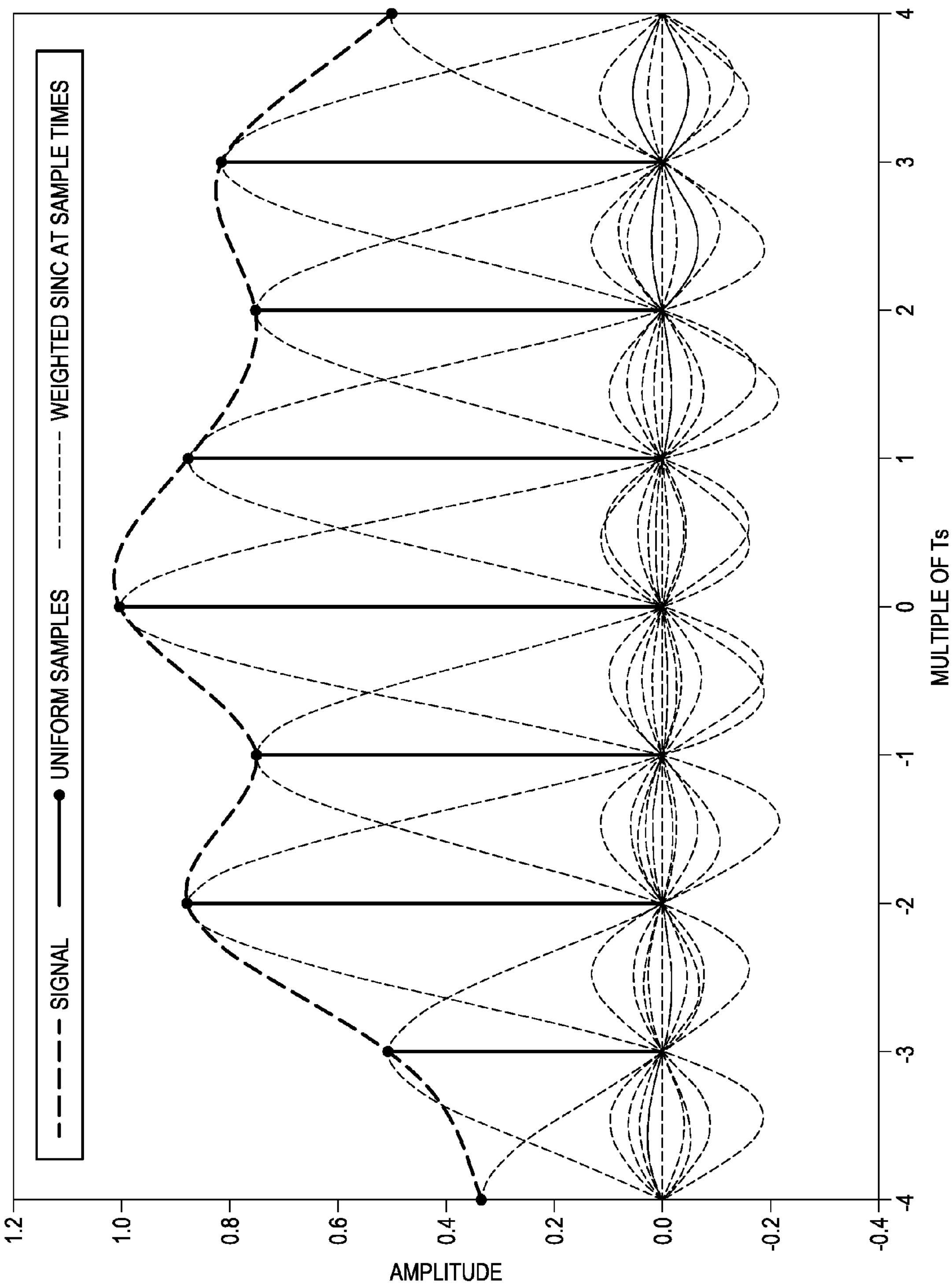

In practice, to reduce complexity, only a finite number of side-lobes of the sinc functions are retained by windowing. In one of the embodiments, a Blackman-Harris windowed sinc with w=7 side-lobes on either side is used (stored in a Look-up-table) as shown in FIG. 15B. Hence, the value of the signal at any asynchronous time-point t can be written in terms of the values at synchronous time-points on either side as given below, $$f(t) = \sum_{n=-w}^{w} f(nT_S) \cdot wsinc(t - nTs)$$

Conventional "Block Solver" algorithms work on a block of asynchronous inputs based on the above equation to formulate a system of equations as given below.

$$[X]_{px1}=[W]_{pxq}\cdot[Z]_{qx1}$$

where X are the asynchronous observations at p time-points, W, are the windowed-sinc functions & Z are the values at q synchronous time-points in the block.

This system of equations is solved in the least-squares sense by the pseudo-inverse computation:

$$Z=W^{+}\cdot X=(W^TW)^{-1}\cdot W^T\cdot X$$

This prior art approach gives the outputs at all the synchronous time-points in the entire block from which a few outputs on either ends are discarded to remove edge effects.

Figure 16:
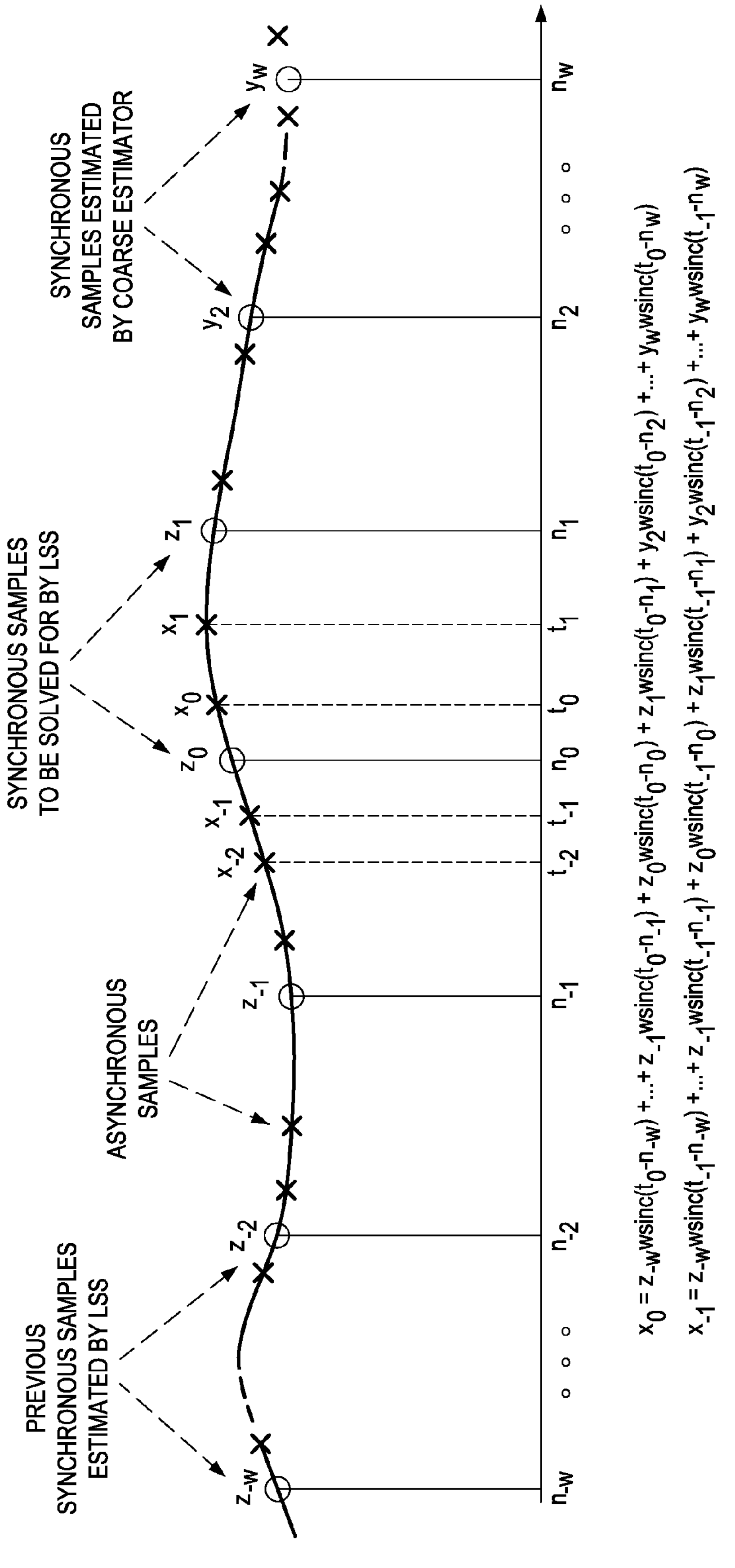
FIG. 16 is a waveform that illustrates the relationships of samples of an asynchronous ADC sampler using the augmented sampler of FIG. 14*a* and FIG. 14*b;*

FIG. 16 shows the points used in estimating the signal value, $z_0$ at the synchronous time point $n_0$.

$$f(t_0)=f(n_{-w})\cdot \mathrm{wsinc}(t_0-n_{-w})+ \ldots +f(n_{-1})\cdot \mathrm{wsinc}(t_0-n_{-1})+f(n_0)\cdot \mathrm{wsinc}(t_0-n_0)+f(n_1)\cdot \mathrm{wsinc}(t_0-n_1)+f(n_2)\cdot \mathrm{wsinc}(t_0-n_2)+ \ldots +f(n_w)\cdot \mathrm{wsinc}(t_0-n_w)$$

Using the coarse estimate $f(n_i)=y_i$ for i>=2 and fine estimate for $f(n_i)=z_i$ for i<2, the above equation can be written as, $$x_0=z_{-w}\mathrm{wsinc}(t_0-n_{-w})+ \ldots +z_{-1}\mathrm{wsinc}(t_0-n_{-1})+z_0\mathrm{wsinc}(t_0-n_0)+z_1\mathrm{wsinc}(t_0-n_1)+y_2\mathrm{wsinc}(t_0-n_2)+ \ldots +y_w\cdot \mathrm{wsinc}(t_0-n_w)$$

Similarly, the equation for the observation $(x_{-1},t_{-1})$ can be written as:

$$x_{-1}=z_{-w}\mathrm{wsinc}(t_{-1}-n_{-w})+ \ldots +z_{-1}\mathrm{wsinc}(t_{-1}-n_{-1})+z_0\mathrm{wsinc}(t_{-1}-n_0)+z\_\mathrm{wsinc}(t_{-1}-n_1)+y_2\mathrm{wsinc}(t_{-1}-n_2)+ \ldots +y_w\mathrm{wsinc}(t_{-1}-n_w)$$

All the $x_i$, $t_i$, $n_m$, $y_m$ & $z_{m(m<0)}$ are known. By looking up the windowed sinc values (wsinc) from lookup tables & evaluating constants, the following equations follow, $$c_0=z_0s_{00}+z_1s_{01} \text{ and } c_{-1}=z_0s_{-10}+z_1s_{-11}$$

where $s_{1m}$=wsinc$(t_1-n_m)$ &

$$c_1=x_1-z_{-w}\mathrm{wsinc}(t_1-n_{-w})- \ldots -z_{-1}\mathrm{wsinc}(t_1-n_{-1})-y_2\mathrm{wsinc}(t_1-n_2)- \ldots -y_w\mathrm{wsinc}(t_1-n_w)$$

From these, $z_0$ can easily be found as $$z_0=(c_0s_{-11}-c_{-1}s_{01})/(s_{00}s_{-11}-s_{-10}s_{01})$$

Thus, in this simple embodiment, the least squares solution reduces to a closed form expression. z1 is not calculated from this set of equations given in Eqn. 8, as it would have a large error since the asynchronous points chosen are far away from it & the sinc function value will be low at that distance.

After $z_0$ is found, the entire window is made to slide and center at n1. $z_1$ & $z_2$ are treated as unknowns, $y_{w+1}$ is taken from Akima and the equations at two asynchronous points around $n_1$ are solved to yield $z_1$. The process is thus repeated at every output point.

In general, the LSS can be formulated to fit many asynchronous observations $(x_i,t_i)$ around the output point, with several $z_m$'s (m>=0) kept unknown ($y_m$'s not used for these). This results in a set of matrix equations $$[C]_{px1}=[S]_{pxq}\cdot[Z]_{qx1},$$

where p is the number of asynchronous observations to solve for & q is the number of unknown synchronous outputs.

This can be solved by the pseudo-inverse computation:

$$Z=S^{+}\cdot C=(S^TS)^{-1}\cdot S^T\cdot C.$$

For small matrix sizes, it may be practical to get a closed-form expression for the output z0. Increasing the window size, w gives better performance, and it could be used to reduce complexity by lowering p & q (and offset the performance loss due to this).

Contrast this with conventional formulations which solve simultaneous equations at all the asynchronous points in a block (usually needs a pseudo-inverse computation of a large sized matrix).

In FIG. 17, a comparison of the complexity of the proposed algorithm with other prior art is given. Operations are listed in terms of multiplications, additions & table look-ups at the input asynchronous rate, $R_A$ and output synchronous rate, $R_s$. For typical bit-widths, a multiply operation can be considered equivalent to 16 addition operations, so this mostly determines the algorithm complexity and power in a hardware implementation. Divisions are implemented as a look-up table (LUT) followed by a multiplier. As an illustration, the number of multiply operations is shown for the case the asynchronous rate is 12× the largest bandwidth of the input signal (i.e. $R_A=6R_S$ assuming the output is sampled at the nyquist rate).

Note that the complexity of the three algorithms, namely the Akima, the modified Akima and the Augmented LSS scheme are dependent only on the synchronous output rate ($R_s$), while the cubic spline and the block solver solutions depend on the asynchronous input rate ($R_A$) in addition to the synchronous output rate. Assuming $R_A=6R_s$ as seen in typical applications, the complexity of the modified Akima is the least, followed by the original Akima algorithm and then the cubic spline. The proposed scheme, augmented LSS, is similar in multiplicative complexity to the cubic spline, and is lower in additive complexity.

In addition, FIG. 18 shows the reconstruction performance of the various algorithms. It can be seen that original Akima algorithm has the lowest performance, followed by the modified Akima and then the reference Akima. But the performance difference between these three algorithms is small, although their complexity difference, as seen from FIG. 17, is large. Thus the Akima algorithm and its modified versions offer attractive performance-complexity tradeoffs compared to the reference spline algorithm. The performance—complexity tradeoff gets more attractive for the proposed LSS algorithm as it provides significantly better performance at complexity comparable to the cubic spline algorithm.

Block solver algorithms give very good results, but have a very high implementation cost, so have not been considered in this comparison.

Figure 19:
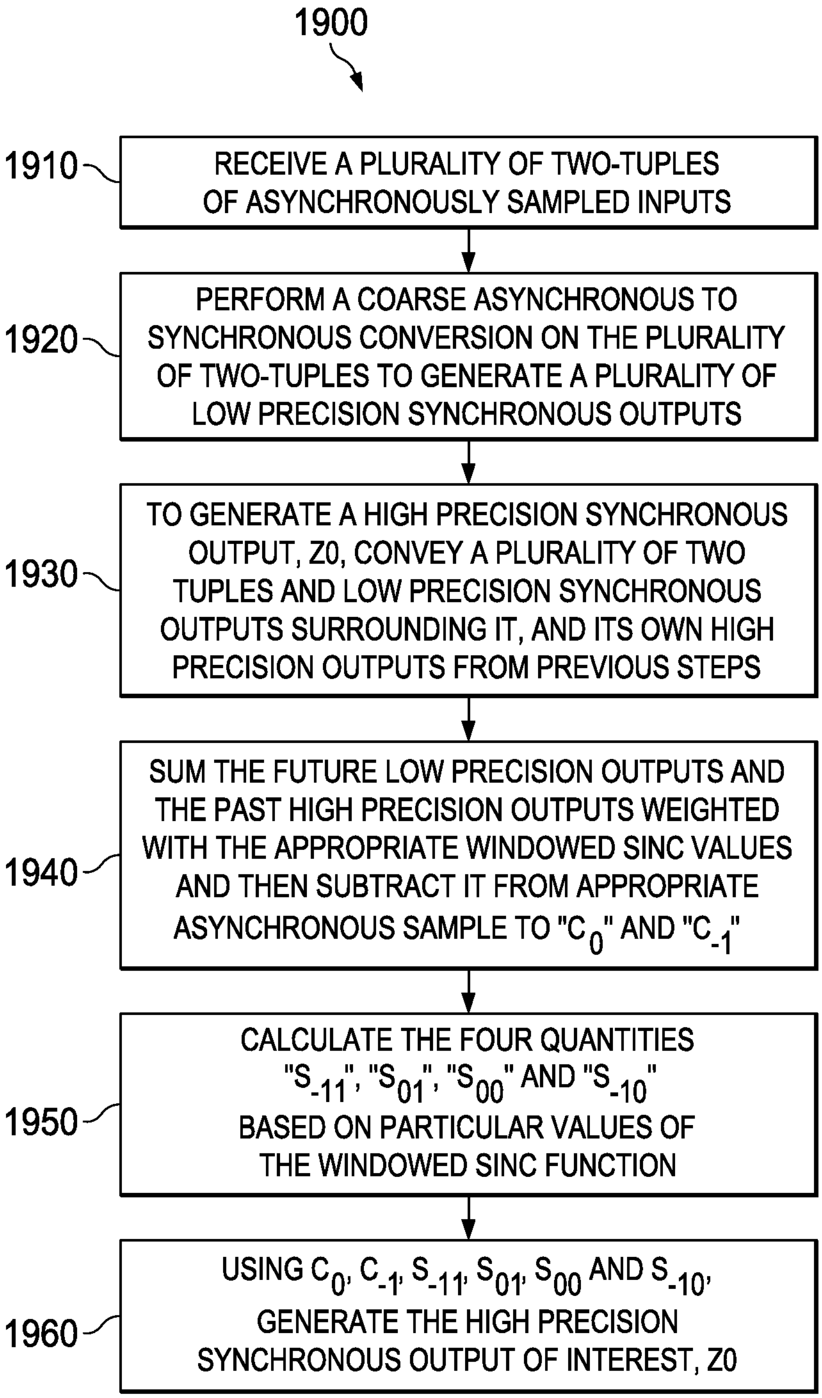
FIG. 19 is a method of an augmented least squares solver for generating synchronous data points from an asynchronous signal constructed according to the principles of the present application.

FIG. 19 illustrates a method 1900 of generating an improved synchronous value from the least squares solvers 1420 (FIG. 14A) and 1430 (FIG. 14B).

In a step 1910, the coarse reconstruction 1410 or the modified Akima reconstruction 1460 receives a plurality of 2-tuples of asynchronously sampled Inputs.

In a step 1920 a coarse asynchronous to synchronous conversion is performed on the plurality of 2-tuples to generate a plurality of low precision synchronous outputs.

In a step 1930, a high precision synchronous output, $z_0$ is generated, and is conveyed as well as a plurality of two tuples and low precision synchronous outputs after it, and its own previous high precision outputs (from previous steps).

In a step 1940, $c_0$ and $c_{-1}$ are calculated by summing the future low precision outputs and the past high precision outputs, after they are weighted with the appropriate windowed sinc. values and then subtracted from appropriate asynchronous samples.

In a step 1950, the four quantities he four quantities "$s_{-11}$", "$s_{01}$","$s_{00}$" and "$s_{-10}$" are calculated based on particular values of the windowed sinc. function.

In a step 1960, Using $c_0$, $c_{-1}$, $s_{-11}$, $s_{01}$, $s_{00}$ and $s_{-10}$, the high precision synchronous output of interest, $z_0$ is generated.

Advantages of Least Squares Solver Approach

As compared to traditional block solver based approaches (that solve a simultaneous set of equations at the asynchronous points & require a matrix inversion), the complexity & power consumption of a least squares solver (LSS) reconstruction engine is heavily reduced.

A simple, non-iterative form, involving only forward computations make it conducive to hardware/real-time implementations since pipelining the internal computations does not impact the overall throughput [Note: both Spline interpolation & block solvers suffer from this problem]

Low latency compared to block/matrix inversion based implementations, as we don't have to wait for data of the whole block to reconstruct the first point. [Note: Akima algorithm is well suited for the augmentation as it also has a non-iterative form & low latency]

Those skilled in the art to which this application relates will appreciate that other and further additions, deletions, substitutions and modifications may be made to the described embodiments.

What is claimed is:

1. An apparatus comprising:

a snapout calculator, wherein the snapout calculator determines where the reference levels for outer comparators shall be placed after each asynchronous sample is generated, wherein the snapout calculator includes a slow snapout calculator which generates snapout values which adapt to the slow changing characteristics of an analog input signal, wherein the slow signal is a signal characterized by taking a plurality of signals that cross inner reference levels over a plurality of consecutive sample times;

wherein the snapout calculator is configured to first increase an upper value and lower value of maximum and minimum ranges of sampling on a first sample, and then converges to a range with the end of a consecutive sample time, wherein the apparatus is embodied in an asynchronous sampler of an asynchronous ADC converter.

2. The apparatus of claim 1, wherein the snapout values are further refined by a fast snapout calculator.

3. A method, comprising:

measuring and storing a plurality asynchronous two-tuples for each of the asynchronously sampled inputs;

extracting the voltage measurement of each of these two-tuples;

determining between consecutive asynchronous points, what the voltage difference is between those asynchronously sampled points;

creating a histogram of this information correlating to what the voltage difference is between those asynchronously sampled points;

computing the cumulative distributive function CDF, Fx(x) of the voltage difference between successive asynchronous samples;

selecting by a user a confidence range of the snapout value, and employing the snapout value with the asynchronous ADC converter to define an adaptive snapout range after a sampling has occurred.

4. The method of claim 3, wherein this snapout range is less than a fully allowable snapout range.

5. The method of claim 3, wherein the method is embodied in an asynchronous sampler of an asynchronous ADC converter.

6. The method of claim 3, wherein the snapout can take a value different than a previous snapout.

7. The method of claim 3, wherein an interposing comparator is interposed between the upper and lower outer voltage rails.

8. The method of claim 3, wherein a timeout occurs, and a forced two-tuple is generated, when an asynchronous value is not generated within a predetermined time period, wherein the predetermined time period is dependent on the signal characteristics.

9. The method of claim 3, wherein the maximum allowable snapout value is less than the allowable range of voltage sampling.

10. The method of claim 3, wherein the snapout range is limited by either the upper voltage rail or the lower voltage rail.

11. A method, comprising:

generating a plurality of asynchronous samples;

determining the largest number of Least Significant Bits (LSBs) between two reference levels of the past polling cycle ["referred to as 'p'];

assigning values to escape variables $k_1$ and $k_2$ which denote a degree of tradeoff between escape probability and convergence time;

determining k1 multiplied by p (now referred to as "q");

determining what is the maximum value between q and $k_2$ (referred to as "t");

determining what the logarithm of this value ("t") is in base 2, to generate an intermediate variable;

selecting the minimum value between this intermediate variable and the logarithm of "a slow" snapback values;

after the minimum value is selected, the Ceil function of "mv" is determined (referred to as "mvceil"); and the value mvceil is used as the "fast" snapout value to set up for the next sample collection.

12. The method of claim 11, wherein a snapout occurs after an analog signal sampling occurs, wherein the polling levels are set to a wider range.

13. The method of claim 11, wherein the interposing comparator is interposed between the upper and lower outer voltage rails.

14. The method of claim 11, wherein a timeout occurs, and a forced two-tuple is generated, when an asynchronous value is not generated within a predetermined time period, wherein the predetermined time period is dependent on the signal characteristics.

15. The method of claim 11, wherein the maximum allowable snapout value is less than the allowable range of voltage sampling.

16. The method of claim 11, wherein the snapout range is limited by either the upper voltage rail or the lower voltage rail.

17. The apparatus of claim 1, wherein the maximum allowable snapout value is less than an allowable range of voltage sampling.

* * * * *